United States Patent
Yang et al.

(10) Patent No.: US 11,003,067 B2
(45) Date of Patent: *May 11, 2021

(54) PRESSURIZED TIN COLLECTION BUCKET WITH IN-LINE DRAINING MECHANISM

(71) Applicant: TAIWAN SEMICONDUCTOR MANUFACTURING CO., LTD., Hsinchu (TW)

(72) Inventors: Chi Yang, Tainan (TW); Hsin-Feng Chen, Yilan (TW); Li-Jui Chen, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/816,255

(22) Filed: Mar. 12, 2020

(65) Prior Publication Data

US 2020/0209731 A1 Jul. 2, 2020

Related U.S. Application Data

(63) Continuation of application No. 16/735,283, filed on Jan. 6, 2020, which is a continuation of application No. 16/289,492, filed on Feb. 28, 2019, now Pat. No. 10,527,926.

(60) Provisional application No. 62/753,905, filed on Oct. 31, 2018.

(51) Int. Cl.
| | |
|---|---|
| *G03F 1/22* | (2012.01) |
| *G03F 7/20* | (2006.01) |
| *G03F 1/70* | (2012.01) |
| *G03F 1/42* | (2012.01) |

(52) U.S. Cl.
CPC ............ *G03F 1/22* (2013.01); *G03F 1/42* (2013.01); *G03F 1/70* (2013.01); *G03F 7/70033* (2013.01)

(58) Field of Classification Search
CPC .... G03F 7/70033; G03F 7/70025; G03F 1/22; H05G 2/005
USPC ............. 355/67; 250/504 R, 455.11
See application file for complete search history.

(56) References Cited

U.S. PATENT DOCUMENTS

| | | |
|---|---|---|
| 8,796,666 B1 | 8/2014 | Huang et al. |
| 9,093,530 B2 | 7/2015 | Huang et al. |
| 9,184,054 B1 | 11/2015 | Huang et al. |
| 9,256,123 B2 | 2/2016 | Shih et al. |
| 9,529,268 B2 | 12/2016 | Chang et al. |
| 9,548,303 B2 | 1/2017 | Lee et al. |
| 9,618,837 B2 | 4/2017 | Lu et al. |
| 9,869,928 B2 | 1/2018 | Huang et al. |

(Continued)

OTHER PUBLICATIONS

Notice of Allowance issued in related U.S. Appl. No. 16/289,492, dated Nov. 14, 2019.

*Primary Examiner* — Hung Nguyen
(74) *Attorney, Agent, or Firm* — McDermott Will & Emery LLP

(57) ABSTRACT

A droplet collection bucket includes a droplet collection tube, a level sensor positioned on the droplet collection tube, a gate valve configured to close a rear portion of the droplet collection tube, a gas supply configured to supply a gas into the rear portion of the droplet collection tube, a heating element wrapping around the droplet collection tube, and a drain tube connecting an interior of the droplet collection tube with an outside of the droplet collection tube.

20 Claims, 12 Drawing Sheets

(56) References Cited

U.S. PATENT DOCUMENTS

| | | |
|---|---|---|
| 9,869,934 B2 | 1/2018 | Huang et al. |
| 9,869,939 B2 | 1/2018 | Yu et al. |
| 10,527,926 B1 * | 1/2020 | Yang .................... G03F 1/70 |
| 2013/0134326 A1 | 5/2013 | Yabu et al. |
| 2013/0161540 A1 | 6/2013 | Nagai et al. |

* cited by examiner

PRESSURIZED TIN COLLECTION BUCKET WITH IN-LINE DRAINING MECHANISM

CROSS-REFERENCE TO RELATED APPLICATION

This application is a Continuation Application of U.S. patent application Ser. No. 16/735,283 filed on Jan. 6, 2020, now U.S. Pat. No. 10,877,366, which is a Continuation Application of U.S. patent application Ser. No. 16/289,492 filed on Feb. 28, 2019, now U.S. Pat. No. 10,527,926, which claims priority to U.S. Provisional Application No. 62/753,905 filed on Oct. 31, 2018, the entire disclosures of these applications are incorporated herein by reference.

BACKGROUND

As device size shrinks, it is necessary to create finer patterns. Extreme ultraviolet (EUV) photolithography can form finer patterns than ultraviolet photolithography. EUV photolithography relies on plasma formation to emit the EUV light rays.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1A:
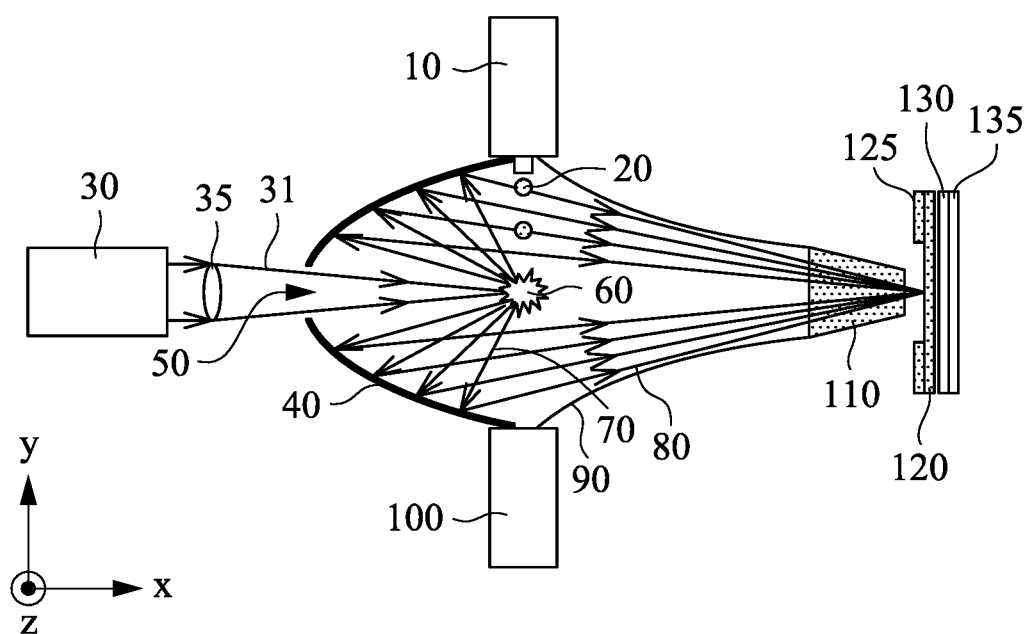
FIG. 1(a) shows a schematic top cross-sectional view of a transmissive EUVL system having an EUV light source, a metal droplet generator, and a metal droplet collection bucket, according to an embodiment of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "being made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described.

With the increasing trend of the Moore's law for decreasing the size of chip components and the demand of higher computing power chips for mobile electronic devices such as smart phones with computer functions, the search for a light source to achieve the size-shrinking demand of chip patterns has resulted in an extreme ultraviolet EUV photolithography technique that uses an EUV radiation source to emit an EUV light with a wavelength of 13.5 nm. Because this wavelength borders the x-ray radiation wavelength region, the EUV radiation source is also called a soft x-ray radiation source. The EUV light generated from plasma formation due to pulsed laser-metal interaction has a pulse duration of about 100 ns and the EUV energy fluence per pulse can be in a range from 100 W to 1 kW at the intermediate focus.

In EUV photolithography, the laser beam hits a first target (i.e. a metal droplet stream) to form plasma which emits EUV light rays which in turn are reflected off a collector mirror and directed toward a second target—the photosensitive coating coated substrate. Since the EUV light rays generated from the plasma travels in all directions, the EUV light rays travelling in a direction opposite to the path toward the target substrate would be wasted if not collected and re-directed towards the intended target. The collector mirror is thus required to collect and re-direct the EUV light rays toward the target substrate and focus the collected light rays to an intermediate focus (IF) for reflecting off a patterned mask or reticle onto a target substrate. The metal droplets are generated by a generator. After being hit by the laser for plasma formation, or after being missed by the laser, the metal droplets would be wasted if not collected for recycling. A metal droplet collection bucket is installed to collect the metal droplets. The metal droplets are collected by the open container of metal droplet collection bucket. When the metal droplets collected in the metal droplet collection bucket reaches a certain level, the molten metal in the metal droplet collection bucket would be evaporated or splashed backward in a direction opposite to the direction of the metal droplets entering the metal droplet collection bucket. Thus, the metal collected in the metal droplet collection bucket needs to be drained out from the metal droplet collection bucket so as to lower the level of the molten metal inside the metal droplet collection bucket. During such drainage, the pressure inside the EUV chamber has to be increased to be the same pressure level as the environment outside the metal droplet collection bucket and the EUV chamber, i.e. the outside ambient atmospheric pressure. During such a pressure increase process, the normal EUV production cannot proceed and the EUV photolithographic process has to be stopped during the period of the drainage. After the drainage, the pressure inside the EUV chamber needs to be lowered by to a certain level by a vacuum pump, delaying the start or the EUV photolithographic process. Therefore, there is a demand for an in-line device structure and a method of in-line operation so that the drainage of the collected metal inside the metal droplet collection bucket can proceed without pausing the EUV photolithographic process.

In embodiments of the present disclosure, the laser-produced plasma source is used. The laser-produced plasma is formed by interaction between laser and a liquid metal. The metal includes tin (Sn) and lithium (Li) in some embodiments of the present disclosure.

FIG. 1(a) shows a schematic cross-sectional view of an EUVL system having an EUV light source in an ideal operation situation. The EUVL system includes a laser generating system 30, a laser-focusing lens 35, an EUV collector mirror 40, a target delivery system or tin droplet ejection system 10, a drain or metal droplet collection bucket 100 for unreacted tin droplets 20, a vane portion 90, a cone portion 110, a patterned mask or reticle 120 held by a mask stage 125, and a target substrate 130 held by a substrate stage 135. The EUV collector mirror 40 is made of a multi-layered mirror including Mo/Si, La/B, La/B$_4$C, Ru/B$_4$C, Mo/B$_4$C, Al$_2$O$_3$/B$_4$C, W/C, Cr/C, and Cr/Sc with a capping layer including SiO$_2$, Ru, TiO$_2$, and ZrO$_2$, in some embodiments of the present disclosure. The diameter of the EUV collector mirror 40 can be about 330 mm to about 750 mm. depending on the chamber size of the EUVL system. The cross-sectional shape of the collector mirror 40 is elliptical or parabolic, in some embodiments of the present disclosure.

Figure 1B:
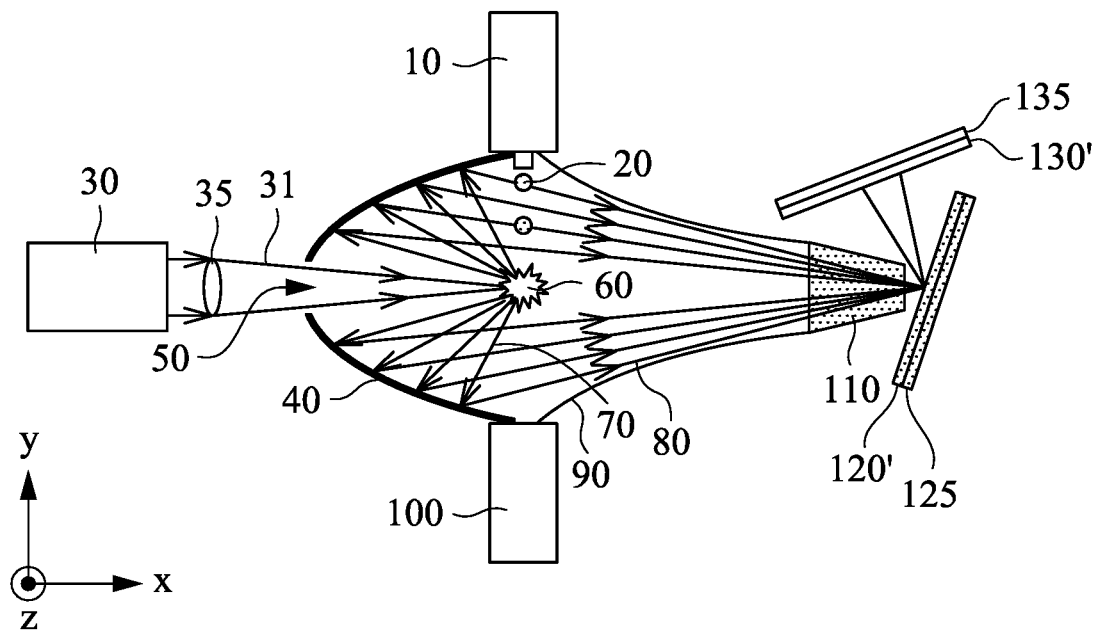
FIG. 1(b) shows a schematic top cross-sectional view of a reflective EUVL system having an EUV light source, a metal droplet generator, and a metal droplet collection bucket, according to another embodiment of the present disclosure.

The target delivery system or tin droplet ejection system 10 ejects tin droplets 20 toward the drain system 100, forming a target stream of tin droplets 20. In operation of the EUVL system, a high-power and high-pulse-repetition-rate laser beam is emitted from a laser source 30 such as a gas discharge laser or a solid state laser. The emitted laser beam is focused through a focusing lens 35 forming a focused laser beam 31 which passes through an aperture 50 formed in an EUV collector mirror 40. The focused laser beam 31 is focused at an ignition site to form plasma 60 through laser-metal interaction between the laser beam 31 and the metal droplets 20 ejected from the ejection system 10. EUV light rays 70 are formed and emitted from the plasma 60 in all directions. The emitted EUV light rays 70 directed toward the EUV collector mirror 40 are reflected as EUV light rays 80 and pass through the region 90 (vane region) and the region 110 (cone region) to another focus (called 'intermediate focus') at which a patterned transmissive mask or reticle 120 is located. The transmissive mask 120 including a pattern having openings is located for the reflected laser beam to pass through the openings and reach the photo-sensitive coating on a target substrate 130 held by a substrate stage 135, facilitating the transmissive EUV photolithography processing of the semiconductor substrate for forming electronic device components or circuits on the semiconductor substrate. In industry, reflective EUV photolithography (FIG. 1(b)) is more common. In reflective EUV photolithography (FIG. 1(b)), a reflective patterned mask 120' or reticle (held by a mask stage 125) with reflective patterns is located at the second focus or intermediate focus to reflect the EUV light rays 80 off the reflective mask 120' in a patternwise manner toward the target substrate 130' held by a substrate stage 135 or through a series of optical components (not shown) to reach the target substrate 130' held by the substrate stage 135. In the transmissive and reflective embodiments shown in FIGS. 1(a) and 1(b), the metal droplets 20 such as tin droplets are collected by the tin catcher or drain or metal droplet collection bucket 100.

Figure 2:
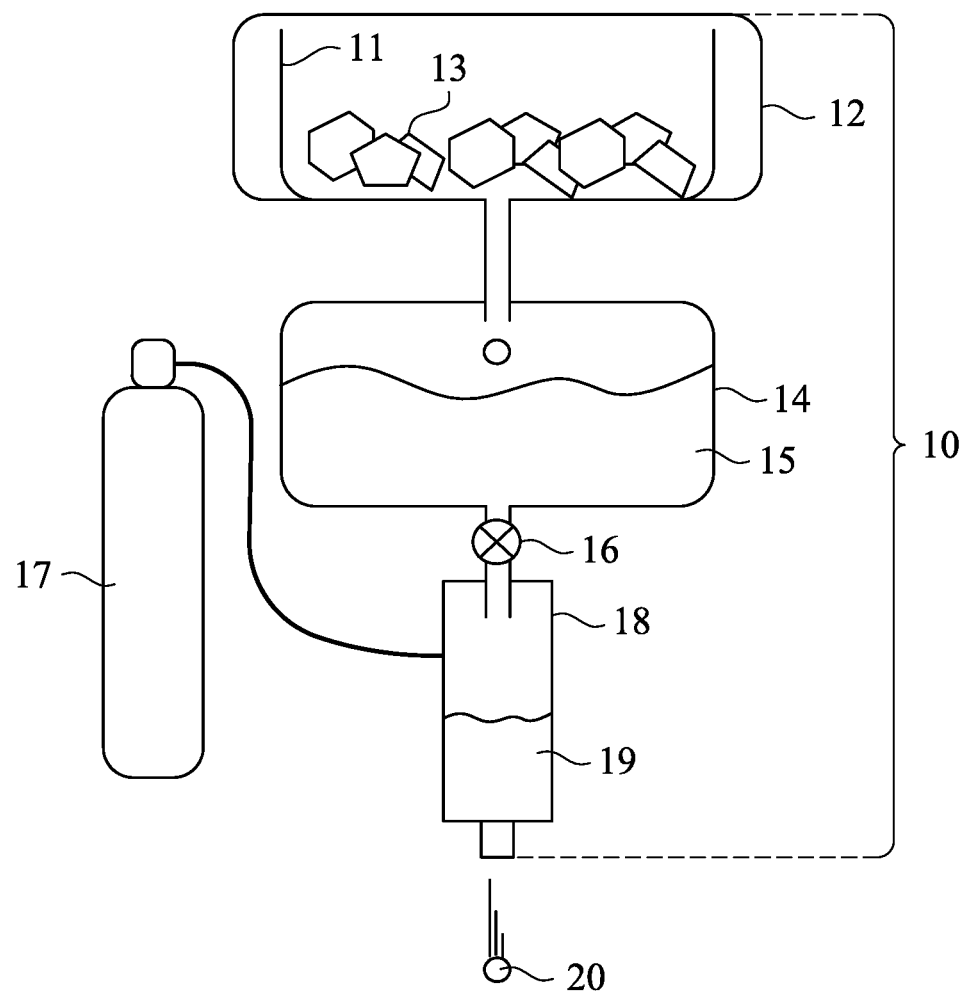
FIG. 2 shows a schematic view of a metal droplet generator, according to an embodiment of the present disclosure.

FIG. 2 shows an apparatus or a target delivery system to form liquid metal droplets for the interaction between laser and the droplets to form a laser-produced plasma source for emission of EUV rays. As shown in FIG. 2, the apparatus includes a container 11 containing solid tin 13. The container 11 is made of a suitable heat-conductive material that does not react with the tin 13 in some embodiments of the present disclosure. The container 11 is enclosed in an enclosure 12 for maintaining a desired atmosphere with a specific gas pressure inside in some embodiments of the present disclosure. In other embodiments of the present disclosure, the enclosure 12 maintains a desired level of vacuum inside the container 11. Also, the enclosure 12 includes a heater (not shown) to provide thermal energy to melt the tin 13. The heater can be any heater, such as a resistive coil heater, gas heater, radiative heater, or magnetic heater, in some embodiments of the present disclosure. The phase-transformed (liquid) tin 15 passes through a delivery tube to a container 14 that collects the liquid tin 15. A valve 16 is included in the target delivery system to control the amount of the liquid tin 15 delivered from the delivery tube to enter the injection system 18. The valve 16 can be any valve such as a solenoid valve, robotic valve, or even manual valve with high precision control, in some embodiments of the present disclosure. The valve 16 is connected to a controller (not shown) to control the valve 16 during the EUV generation process, in some embodiments of the present disclosure. The injection system 18 is connected with a gas cylinder 17 through a gas tube. The gas cylinder 17 stores an inert gas, such as He or nitrogen N$_2$, in some embodiments of the present disclosure. The gas entering the injection system 18 is pressurized to eject the liquid tin 19 to form an ejected tin droplet 20 in a droplet shape for forming plasma 60 (FIG. 3) by laser-metal interaction in some embodiments of the present disclosure. The tin droplet 20 also includes solid particles inside the liquid droplet in some embodiments. The frequency of ejection of the tin droplets 20 is controlled by the controller controlling the injection system 18 or by another controller so as to synchronize with the laser pulse generated by a pulsed laser source, in some embodiments of the present disclosure. The speed of the ejected tin droplet 20 is about 2 ms$^{-1}$ in some embodiments of the present disclosure.

Figure 3:
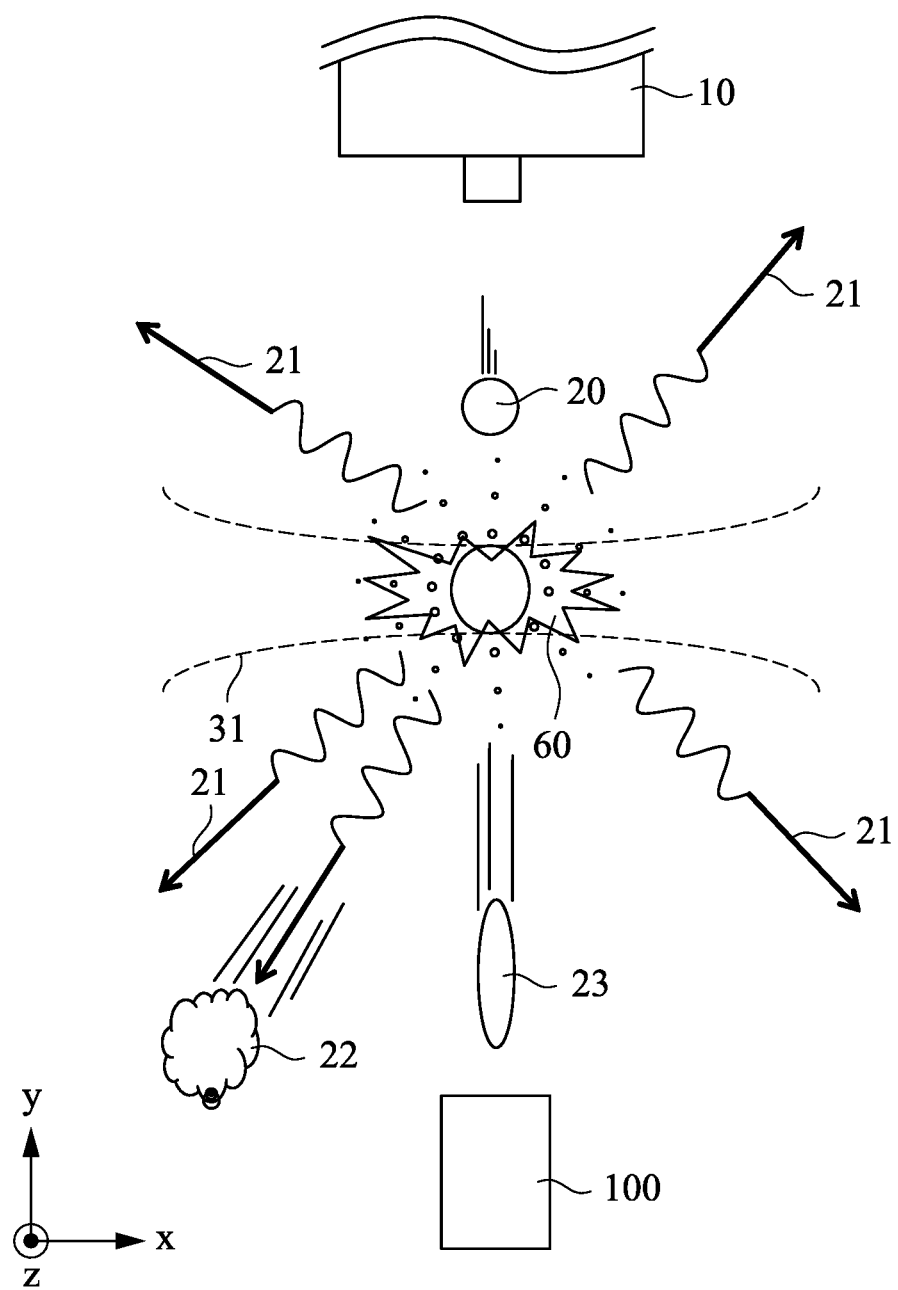
FIG. 3 shows a schematic view of plasma formation in a region between a metal droplet generator and a metal droplet collection bucket, according to an embodiment of the present disclosure.

FIG. 3 shows a schematic view demonstrating the plasma formation process through laser-metal interaction between a high-power and high-pulse-repetition-rate laser beam and a metal droplet. In FIG. 3, the ejected tin droplet 20, from the ejection system 10, passes to a desired spot (also called 'ignition site', 'initiation site', or 'site of fireball') where it interacts with the laser to form plasma. The ignition site is at a focus of the high-power and high-pulse-repetition-rate pulsed laser beam 31. The laser beam 31 may be generated by a gas laser including an excimer gas discharge laser, $CO_2$ laser, helium-neon laser, nitrogen laser, transversely excited atmospheric (TEA) laser, argon ion laser, copper vapor laser, KrF laser or ArF laser; or a solid state laser including Nd:YAG laser, Nd:glass laser, ytterbium-doped glasses or ceramics laser, or a ruby laser. The laser beam 31 interacts with the ejected tin droplet 10 at the ignition site in a space of the chamber of the EUVL system to form plasma 60 which emits EUV light rays 21 in all directions. During this laser-metal interaction, a tin droplet 20 could be missed or not interact sufficiently with the laser beam 31, thereby passing to a position below the ignition site in FIG. 3, forming debris tin droplet 23. Also, some tin leftover from the plasma formation process can be pushed by the emitted photons and become debris 22. The debris droplet 23 and debris 22 can accumulate on the surface of the EUV collector mirror 40 (FIGS. 1(a) and 1(b)), deteriorating the reflective quality of the EUV collector mirror 40. Debris and droplet contaminated collector mirrors need to be more frequently cleaned and/or replaced thereby increasing the manufacturing cost of replacement of the expensive EUV collector mirror 40, and more importantly, increasing manufacturing time and cost for the replacement. Replacement of the EUV collector mirror may require up to a week. Therefore, there is a demand for an improved method of cleaning the EUV collector contaminated by the debris droplet 23 and the debris 22. A metal droplet collection bucket 100 can collect the debris droplet 23, according to some embodiments of the present disclosure. The metal droplets 20 entering the metal droplet collection bucket 100 have a high speed of e.g. 2 ms$^{-1}$ and could cause the problem of splashing of the molten metal 200 (FIG. 4(a)) stored in the metal droplet collection bucket 100. The splashed molten metal 200 could jump out of the metal droplet collection bucket 100 and contaminate the EUV chamber or other important components such as the collector mirror 40, resulting in low-quality EUV light for EUV photolithography or halting the entire EUV process. Therefore, a metal droplet collection bucket that can prevent the splashing problem of the molten metal 200 is demanded.

Figure 4:
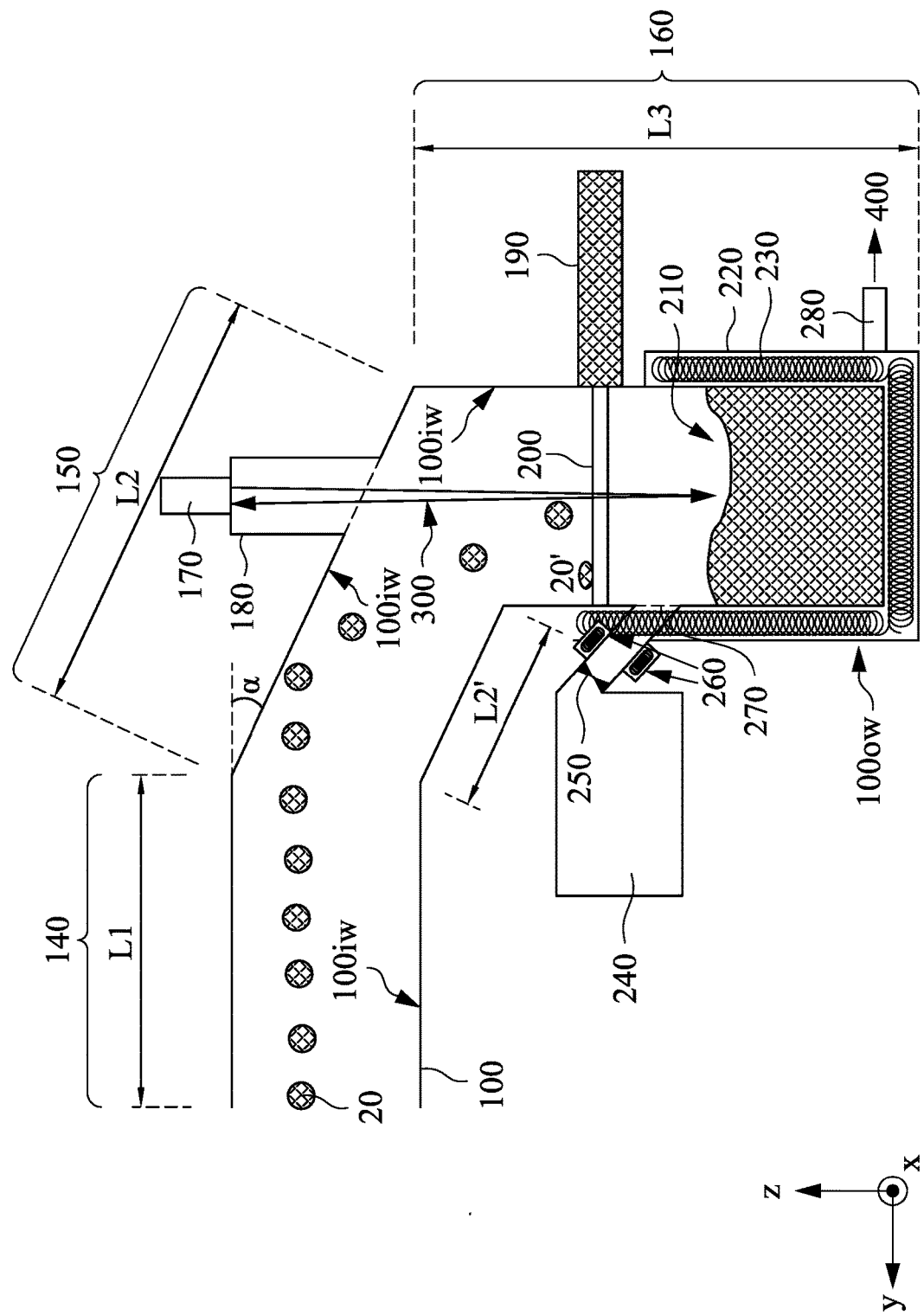
FIG. 4 shows a cross-sectional view of a metal droplet collection bucket, according to an embodiment of the present disclosure.

FIG. 4 shows a cross-sectional view of a metal droplet collection bucket 100. The metal droplet collection bucket 100 has three portions, i.e. a first portion 140, a second or connection portion 150, and a third portion 160, in some embodiments of the present disclosure. The first portion 140 is the portion of the metal droplet collection bucket 100, which the metal droplet 20 first encounters in some embodiments of the present disclosure. The first portion 140 is aligned with the metal droplet ejection system 10 so that the path of the high speed metal droplets 20 passes into the first portion 140 in some embodiments of the present disclosure.

The inner walls 100iw of the first portion 140 are parallel, in some embodiments of the present disclosure. In some embodiments, the first portion 140 has a cylindrical shape with a circular cross section cutting in a path perpendicular to the path of the metal droplets 20, i.e. cutting along the x direction in FIG. 4. The first portion 140 is made of a metal or a metal alloy including stainless steel, copper, aluminum and aluminum alloy, in some embodiments of the present disclosure. The first portion 140 has a length of L1 which is short in the EUV chamber and long inside the metal droplet collection bucket 100 to avoid back-splash of metal droplets 20. The length L1 can be in a range from about 5 cm to about 10 cm in some embodiments of the present disclosure, depending on the speed of the metal droplets 20 and the size of the EUV chamber.

The metal droplet collection bucket 100 also includes a second or connection portion 150. In some embodiments, the second or connection portion 150 is one-piece with the first portion 140 or is a separate part connected with the first portion 140 by an adhesive means such as glue or screws. In some embodiments, the second or connection portion 150 is made of the same material as the first portion 140. In other embodiments, the second or connection portion 150 is made of a material different from that of the first portion 140. In some embodiments, the second or connection portion 150 deviates at an angle α from the lengthwise axis of the first portion 140. The second or connection portion 150 has its greatest length of L2 and its smallest length of L2' and in some embodiments, the greatest length L2 is the same as the length L1 of the first portion 140. In some embodiments, the length L2' is non-zero. In other embodiments, the length L2' is zero (not shown) and the first portion 140 directly contacts the third portion 160. In some embodiments, in the second or connection portion 150, a level sensor 170 is installed on a protruding portion 180 which allows a light 300, such as laser, to pass from the level sensor 170 through the protruding portion 180 to the top surface 210 of the collected molten metal and from the top surface 210 to pass through the protruding portion 180, back to the level sensor 170 for detecting a surface level of the molten metal in the third portion 160. In some embodiments, the level sensor 170 is connected to the gate valve controller 190 including at least one processor which sets a threshold of the surface level, the processor sends a signal to the gate valve controller 190 to move the gate valve 200 to block the metal droplets 20 from entering the space occupied by the collected molten metal. In some embodiments, the level sensor 170 has a lengthwise axis aligned with the lengthwise axis of the third portion 160.

The third portion 160 of the metal droplet collection bucket 100 has its greatest length L3 connected to the greatest length L2 of the second or connection portion 150. The third portion 160 is formed to be one-piece with the second or connection portion 150 or formed to be a separate part connected with the second or connection portion 150 by adhesive means such as glue or screws. The central axis of the third portion 160 is perpendicular to the central axis of the first portion 140. In some embodiments, the third portion is made of the same material as the second or connection portion 150 and the first portion 140. In other embodiments, the third portion 160 is made of a material different from that of the second or connection portion 150 which is made of the same material as the first portion 140. In some embodiments, the first portion 140, the second or connection portion 150, and the third portion 160 are made of different materials.

In the third portion 160, a gate valve controller 190 is installed with a valve 200, in some embodiments. Upon receiving a signal from the controller of the level sensor 170, the gate valve controller 190 is configured to move the valve 200 into the space above the top surface level of the molten metal collected in the third portion 160. The valve 200 is configured to be positioned horizontally, i.e. along the y direction in FIG. 4, with respect to the central axis of the third portion 160. In this way, the metal droplet 20 will be immobilized on the valve 200 as immobilized metal 20' and will not cause any back-splash of the molten metal in the third portion 160. The valve 200 conceals the space below the valve 200 so that the molten metal cannot evaporate to the first portion 140 or second portion 150.

In FIG. 4, a gas supply 240 is installed with an outlet guarded by a valve 250. After closing the valve 200, the valve 250 of the gas supply 240 is opened to allow the gas to pass into the outlet tube. In some embodiments, the gas includes inert gas such as argon and nitrogen. On the outlet tube, heaters 260 are installed to heat the outlet tube so as to heat the gas passing through the outlet tube. The heaters 260 include a resistive heater, radiation heater, and flame heater. Then, the heated gas passes through a mesh or dust filter 270 so as to allow only clean heated gas to enter the space above the top surface level of the molten metal collected in the third portion 160. The heated gas increases the pressure in the space below the valve 200 to be the same as the pressure outside the third portion 160, i.e. ambient atmospheric pressure. Once the ambient atmospheric pressure is reached, the tube 280 is opened to allow drainage of the molten metal to a drainage tool 400 such as an open bucket. Since the valve 200 is closed, the first and second portions of the metal droplet collection bucket 100 can be maintained at a low pressure. After the drainage operation is finished, the third portion is vacuumed by opening the valve 200 or vacuumed via a pump connected to the third portion, and after the pressure in the third portion becomes substantially equal to the pressure in the first and second portions, the valve 200 is opened to collect metal droplets.

In FIG. 4, a heating element 230 wraps around the third portion 160 up to the valve 200. The heating element 230 is enclosed in a portion 220 positioned in the metal droplet collection bucket 100. The heating element 230 maintains the metal collected in the third portion 160 in a molten state for drainage. Also, the heating element 230 covering the space above the top surface level of the molten metal can assist heating of the gas entering the space from the gas supply 240. In some embodiments, the heating element 230 covers the entire third portion 160. In other embodiments, the heating element 230 partially covers the third portion 160. In some embodiments, the tube 280 is guarded by a tap or valve (not shown). The inner wall or surface of the first, second, and third portions 140, 150, 160 is labeled 100iw, and the outer wall or surface is labeled 100ow.

Figure 5:
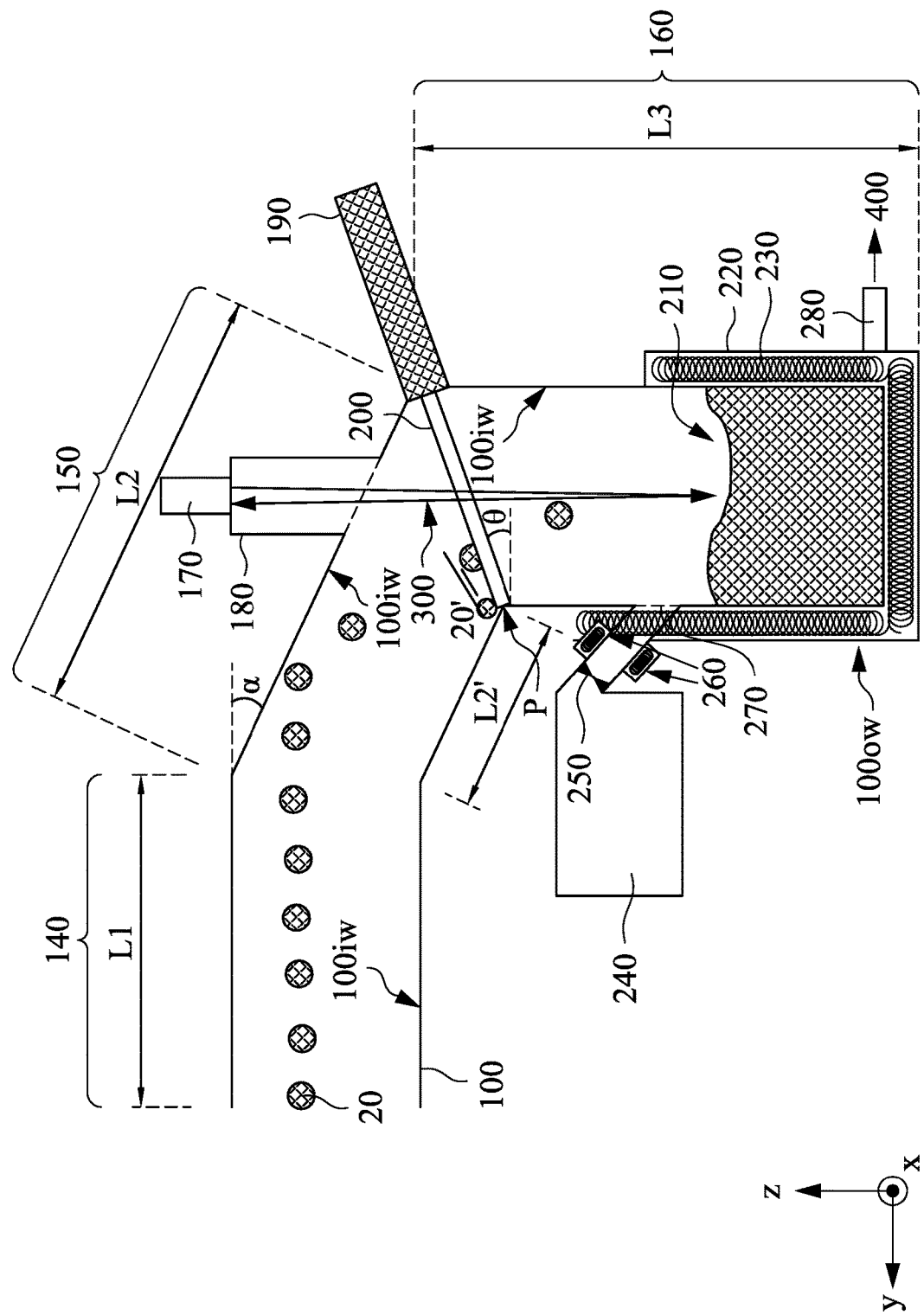
FIG. 5 shows a cross-sectional view of a metal droplet collection bucket, according to another embodiment of the present disclosure.

FIG. 5 shows a cross-sectional view of a metal droplet collection bucket 100. Compared with the metal droplet collection bucket 100 in FIG. 4, the metal droplet collection bucket 100 has the valve 200 installed at an angle θ (θ is greater than 0 degrees and less than 90 degrees) with respect to the lengthwise axis of the first portion 140. In this way, the metal droplet 20 blocked by the valve 200 can flow to a left edge of the valve 200 and becomes immobilized metal droplet 20'. When the valve 200 is opened, metal droplets 20' can easily flow to the third portion 160.

In FIG. 5, the metal droplet collection bucket 100 has three portions, i.e. a first portion 140, a second or connection portion 150, and a third portion 160, in some embodiments of the present disclosure. The first portion 140 is the portion of the metal droplet collection bucket 100, which the metal droplet 20 first encounters in some embodiments of the present disclosure. The first portion 140 is aligned with the metal droplet ejection system 10 so that the path of the high speed metal droplets 20 passes into the first portion 140, in some embodiments of the present disclosure. The inner walls 100iw of the first portion 140 are parallel, in some embodiments of the present disclosure. In some embodiments, the first portion 140 has a cylindrical shape with a circular cross section cutting in a path perpendicular to the path of the metal droplets 20, i.e. cutting along the x direction in FIG. 5. The first portion 140 is made of a metal or a metal alloy including stainless steel, copper, aluminum and aluminum alloy, in some embodiments of the present disclosure. The first portion 140 has a length of L1 which is designed to be short in a small EUV chamber and is designed to be long to avoid back-splash of metal droplets 20 inside the metal droplet collection bucket 100. The length L1 can be in a range from about 5 cm to about 10 cm in some embodiments of the present disclosure, depending on the speed of the metal droplets 20 and the size of the EUV chamber.

The metal droplet collection bucket 100 also includes a second or connection portion 150. In some embodiments, the second or connection portion 150 is one-piece with the first portion 140 or is a separate part connected with the first portion 140 by an adhesive means such as glue or screws. In some embodiments, the second or connection portion 150 is made of the same material as the first portion 140. In other embodiments, the second or connection portion 150 is made of a material different from that of the first portion 140. In some embodiments, the second or connection portion 150 deviates at an angle α from the lengthwise axis of the first portion 140. The second or connection portion 150 has its greatest length of L2 and its smallest length of L2' and in some embodiments, the greatest length L2 is the same as the length L1 of the first portion 140. In some embodiments, the length L2' is non-zero. In other embodiments, the length L2' is zero (not shown) and the first portion 140 directly contacts the third portion 160. In some embodiments, in the second or connection portion 150, a level sensor 170 is installed on a protruding portion 180 which allows a light 300, such as laser, to pass from the level sensor 170 through the protruding portion 180 to the top surface 210 of the collected molten metal and from the top surface 210 to pass through the protruding portion 180, back to the level sensor 170 for detecting a surface level of the molten metal in the third portion 160. In some embodiments, the level sensor 170 is connected to the gate valve controller 190 including at least one processor which sets a threshold of the surface level, the processor sends a signal to the gate valve controller 190 to move the gate valve 200 to block the metal droplets 20 from entering the space occupied by the collected molten metal. In some embodiments, the level sensor 170 has a lengthwise axis aligned with the lengthwise axis of the third portion 160.

The third portion 160 of the metal droplet collection bucket 100 has its greatest length L3 connected to the greatest length L2 of the second or connection portion 150. The third portion 160 is formed to be one-piece with the second or connection portion 150 or formed to be a separate part connected with the second or connection portion 150 by adhesive means such as glue or screws. The central axis of the third portion 160 is perpendicular to the central axis of the first portion 140. In some embodiments, the third portion is made of the same material as the second or connection portion 150 and the first portion 140. In other embodiments, the third portion 160 is made of a material different from that of the second or connection portion 150 which is made of the same material as the first portion 140. In some embodiments, the first portion 140, the second or connection portion 150, and the third portion 160 are made of different materials.

In the third portion 160, a gate valve controller 190 is installed with a valve 200 at a position between the second portion 150 and the third portion 160 and at an angle θ (θ is greater than 0 degrees and less than 90 degrees) with respect to the lengthwise axis of the first portion 140, i.e. the y direction, in some embodiments. Upon receiving a signal from the controller of the level sensor 170, the gate valve controller 190 is configured to move the valve 200 into the space above the top surface level of the molten metal collected in the third portion 160. In this way, the metal droplet 20 will be immobilized on the valve 200 as immobilized metal droplet 20' and will not cause any back-splash of the molten metal in the third portion 160. The valve 200 conceals the space below the valve 200 so that the molten metal cannot evaporate to the first portion 140 or second portion 150. When the valve 200 is opened, metal droplets 20' can easily flow to the third portion 160.

In FIG. 5, a gas supply 240 is installed with an outlet guarded by a valve 250. After closing the valve 200, the valve 250 of the gas supply 240 is opened to allow the gas to pass into the outlet tube. In some embodiments, the gas includes inert gas such as argon and nitrogen. On the outlet tube, heaters 260 are installed to heat the outlet tube so as to heat the gas passing through the outlet tube. The heaters 260 include a resistive heater, radiation heater, and flame heater. Then, the heated gas passes through a mesh or dust filter 270 so as to allow only clean heated gas to enter the space above the top surface level of the molten metal collected in the third portion 160. The heated gas increases the pressure in the space below the valve 200 to be the same as the pressure outside the third portion 160, i.e. ambient atmospheric pressure. Once the ambient atmospheric pressure is reached, the tube 280 is opened to allow drainage of the molten metal to a drainage tool 400 such as an open bucket. Since the valve 200 is closed, the first and second portions of the metal droplet collection bucket 100 can be maintained at a low pressure. After the drainage operation is finished, the third portion is vacuumed by opening the valve 200 or vacuumed via a pump connected to the third portion, and after the pressure in the third portion becomes substantially equal to the pressure in the first and second portions, the valve 200 is opened to collect metal droplets.

In FIG. 5, a heating element 230 wraps around the third portion 160 up to the valve 200. The heating element 230 is enclosed in a portion 220 positioned in the metal droplet collection bucket 100. The heating element 230 maintains the metal collected in the third portion 160 in a molten state for drainage. Also, the heating element 230 covering the space above the top surface level of the molten metal can assist heating of the gas entering the space from the gas supply 240. In some embodiments, the heating element 230 covers the entire third portion 160. In other embodiments, the heating element 230 partially covers the third portion 160. In some embodiments, the tube 280 is guarded by a tap or valve (not shown). The inner wall or surface of the first, second, and third portions 140, 150, 160 is labeled 100$iw$, and the outer wall or surface is labeled 100$ow$.

Figure 6:
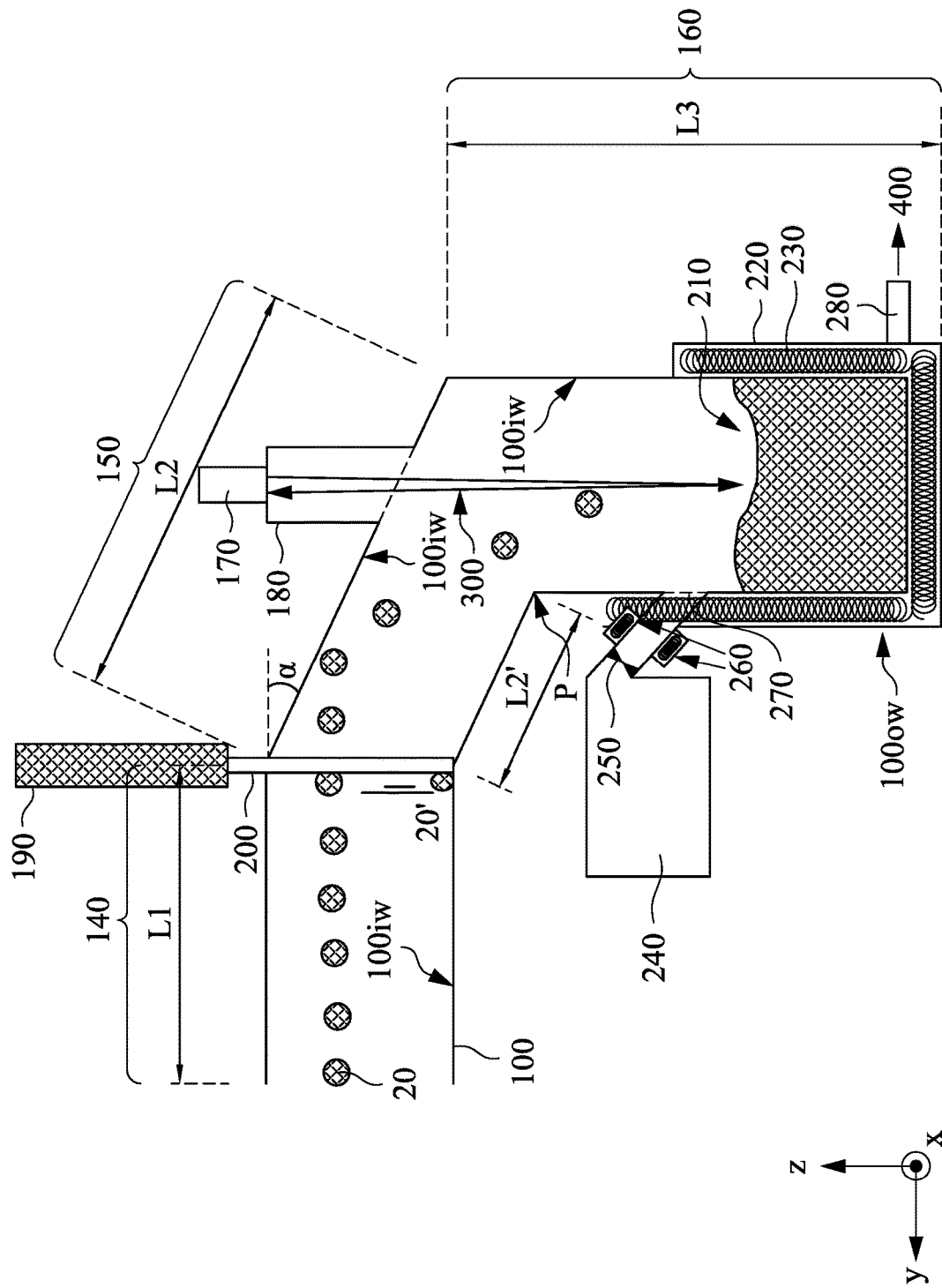
FIG. 6 shows a cross-sectional view of a metal droplet collection bucket, according to another embodiment of the present disclosure.

FIG. 6 shows a cross-sectional view of a metal droplet collection bucket 100.

Compared with the metal droplet collection bucket 100 in FIGS. 4 and 5, the metal droplet collection bucket 100 has the valve 200 installed at 90 degrees with respect to the lengthwise axis (y axis) of the first portion 140. In this way, the metal droplet 20 blocked by the valve 200 can flow to a bottom edge of the valve 200 and becomes immobilized metal droplet 20'. When the valve 200 is opened, metal droplets 20' can easily flow to the second and third portions 150 and 160.

In FIG. 6, the metal droplet collection bucket 100 has three portions, i.e. a first portion 140, a second or connection portion 150, and a third portion 160, in some embodiments of the present disclosure. The first portion 140 is the portion of the metal droplet collection bucket 100, which the metal droplet 20 first encounters in some embodiments of the present disclosure. The first portion 140 is aligned with the metal droplet ejection system 10 so that the path of the high speed metal droplets 20 passes into the first portion 140, in some embodiments of the present disclosure. The inner walls 100$iw$ of the first portion 140 are parallel, in some embodiments of the present disclosure. In some embodiments, the first portion 140 has a cylindrical shape with a circular cross section cutting in a path perpendicular to the path of the metal droplets 20, i.e. cutting along the x direction in FIG. 6. The first portion 140 is made of a metal or a metal alloy including stainless steel, copper, aluminum and aluminum alloy, in some embodiments of the present disclosure. The first portion 140 has a length of L1 which is designed to be short in a small EUV chamber and is designed to be long to avoid back-splash of metal droplets 20 inside the metal droplet collection bucket 100. The length L1 can be in a range from about 5 cm to about 10 cm in some embodiments of the present disclosure, depending on the speed of the metal droplets 20 and the size of the EUV chamber.

A gate valve controller 190 is installed with a valve 200 at a position between the second portion 150 and the first portion 140 and at 90 degrees with respect to the lengthwise axis of the first portion 140, i.e. the y direction, in some embodiments. Upon receiving a signal from the controller of the level sensor 170, the gate valve controller 190 is configured to move the valve 200 into the space above the top surface level of the molten metal collected in the third portion 160. In this way, the metal droplet 20 will be immobilized on the valve 200 as immobilized metal droplet 20' and will not cause any back-splash of the molten metal in the third portion 160. The valve 200 conceals the space below the valve 200 so that the molten metal cannot evaporate to the first portion 140 or second portion 150. When the valve 200 is opened, metal droplets 20' can easily flow to the second and third portions 150 and 160.

The metal droplet collection bucket 100 also includes a second or connection portion 150. In some embodiments, the second or connection portion 150 is one-piece with the first portion 140 or is a separate part connected with the first portion 140 by an adhesive means such as glue or screws. In some embodiments, the second or connection portion 150 is made of the same material as the first portion 140. In other embodiments, the second or connection portion 150 is made of a material different from that of the first portion 140. In some embodiments, the second or connection portion 150 deviates at an angle α from the lengthwise axis of the first portion 140. The second or connection portion 150 has its greatest length of L2 and its smallest length of L2' and in some embodiments, the greatest length L2 is the same as the length L1 of the first portion 140. In some embodiments, the length L2' is non-zero. In other embodiments, the length L2' is zero (not shown) and the first portion 140 directly contacts the third portion 160. In some embodiments, in the second or connection portion 150, a level sensor 170 is installed on a protruding portion 180 which allows a light 300, such as laser, to pass from the level sensor 170 through the protruding portion 180 to the top surface 210 of the collected molten metal and from the top surface 210 to pass through the protruding portion 180, back to the level sensor 170 for detecting a surface level of the molten metal in the third portion 160. In some embodiments, the level sensor 170 is connected to the gate valve controller 190 including at least one processor which sets a threshold of the surface level, the processor sends a signal to the gate valve controller 190 to move the gate valve 200 to block the metal droplets 20 from entering the space occupied by the collected molten metal. In some embodiments, the level sensor 170 has a lengthwise axis aligned with the lengthwise axis of the third portion 160.

The third portion 160 of the metal droplet collection bucket 100 has its greatest length L3 connected to the greatest length L2 of the second or connection portion 150. The third portion 160 is formed to be one-piece with the second or connection portion 150 or formed to be a separate part connected with the second or connection portion 150 by adhesive means such as glue or screws. The central axis of the third portion 160 is perpendicular to the central axis of the first portion 140. In some embodiments, the third portion is made of the same material as the second or connection portion 150 and the first portion 140. In other embodiments, the third portion 160 is made of a material different from that of the second or connection portion 150 which is made of the same material as the first portion 140. In some embodiments, the first portion 140, the second or connection portion 150, and the third portion 160 are made of different materials.

In FIG. 6, a gas supply 240 is installed with an outlet guarded by a valve 250. After closing the valve 200, the valve 250 of the gas supply 240 is opened to allow the gas to pass into the outlet tube. In some embodiments, the gas includes inert gas such as argon and nitrogen. On the outlet tube, heaters 260 are installed to heat the outlet tube so as to heat the gas passing through the outlet tube. The heaters 260 include a resistive heater, radiation heater, and flame heater. Then, the heated gas passes through a mesh or dust filter 270 so as to allow only clean heated gas to enter the space above the top surface level of the molten metal collected in the third portion 160. The heated gas increases the pressure in the space below the valve 200 to be the same as the pressure outside the third portion 160, i.e. ambient atmospheric pressure. Once the ambient atmospheric pressure is reached, the tube 280 is opened to allow drainage of the molten metal to a drainage tool 400 such as an open bucket. Since the valve 200 is closed, the first and second portions of the metal droplet collection bucket 100 can be maintained at a low pressure. After the drainage operation is finished, the third portion is vacuumed by opening the valve 200 or vacuumed via a pump connected to the third portion, and after the pressure in the third portion becomes substantially equal to the pressure in the first and second portions, the valve 200 is opened to collect metal droplets.

In FIG. 6, a heating element 230 wraps around the third portion 160 up to the valve 200. The heating element 230 is enclosed in a portion 220 positioned in the metal droplet collection bucket 100. The heating element 230 maintains the metal collected in the third portion 160 in a molten state for drainage. Also, the heating element 230 covering the space above the top surface level of the molten metal can assist heating of the gas entering the space from the gas supply 240. In some embodiments, the heating element 230 covers the entire third portion 160. In other embodiments, the heating element 230 partially covers the third portion 160. In some embodiments, the tube 280 is guarded by a tap or valve (not shown). The inner wall or surface of the first, second, and third portions 140, 150, 160 is labeled 100*iw*, and the outer wall or surface is labeled 100*ow*.

Figure 7:
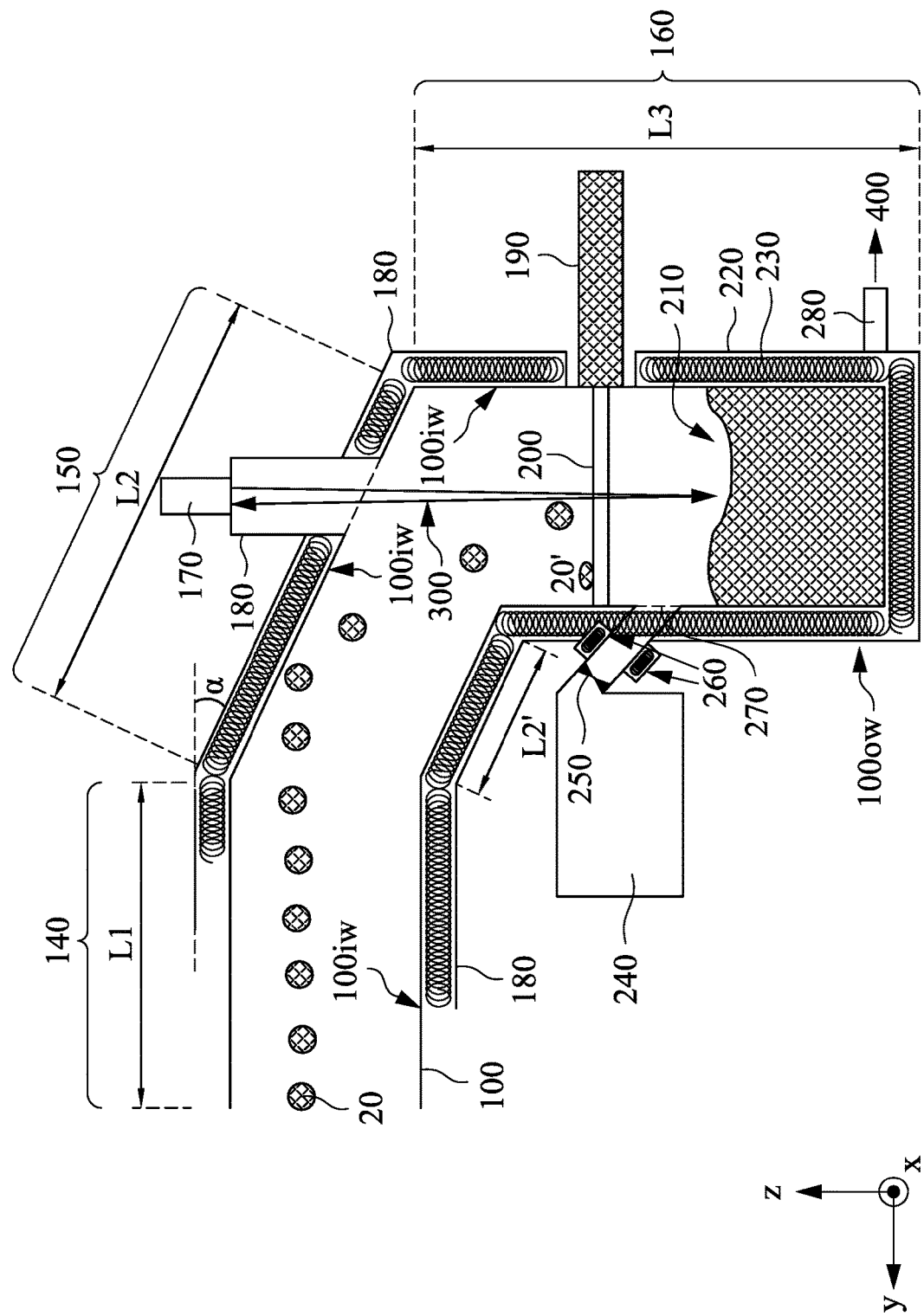
FIG. 7 shows a cross-sectional view of a metal droplet collection bucket, according to another embodiment of the present disclosure.

FIG. 7 shows a cross-sectional view of a metal droplet collection bucket 100.

Compared with the embodiment in FIG. 4, the metal droplet collection bucket 100 includes heating element 230 which covers the first, second and third portions 140, 150 and 160, instead of just covering the third portion 160. In this way, heat is applied to the first and second portions 140 and 150 so as to maintain the liquid state of the metal droplets 20 that hit against the inner wall 100*iw* of the first and second portions 140 and 150.

The metal droplet collection bucket 100 has three portions, i.e. a first portion 140, a second or connection portion 150, and a third portion 160, in some embodiments of the present disclosure. The first portion 140 is the portion of the metal droplet collection bucket 100, which the metal droplet 20 first encounters in some embodiments of the present disclosure. The first portion 140 is aligned with the metal droplet ejection system 10 so that the path of the high speed metal droplets 20 passes into the first portion 140, in some embodiments of the present disclosure. The inner walls 100*iw* of the first portion 140 are parallel, in some embodiments of the present disclosure. In some embodiments, the first portion 140 has a cylindrical shape with a circular cross section cutting in a path perpendicular to the path of the metal droplets 20, i.e. cutting along the x direction in FIG. 7. The first portion 140 is made of a metal or a metal alloy including stainless steel, copper, aluminum and aluminum alloy, in some embodiments of the present disclosure. The first portion 140 has a length of L1 which is designed to be short in a small EUV chamber and is designed to be long to avoid back-splash of metal droplets 20 inside the metal droplet collection bucket 100. The length L1 can be in a range from about 5 cm to about 10 cm in some embodiments of the present disclosure, depending on the speed of the metal droplets 20 and the size of the EUV chamber.

The metal droplet collection bucket 100 also includes a second or connection portion 150. In some embodiments, the second or connection portion 150 is one-piece with the first portion 140 or is a separate part connected with the first portion 140 by an adhesive means such as glue or screws. In some embodiments, the second or connection portion 150 is made of the same material as the first portion 140. In other embodiments, the second or connection portion 150 is made of a material different from that of the first portion 140. In some embodiments, the second or connection portion 150 deviates at an angle α from the lengthwise axis of the first portion 140. The second or connection portion 150 has its greatest length of L2 and its smallest length of L2' and in some embodiments, the greatest length L2 is the same as the length L1 of the first portion 140. In some embodiments, the length L2' is non-zero. In other embodiments, the length L2' is zero (not shown) and the first portion 140 directly contacts the third portion 160. In some embodiments, in the second or connection portion 150, a level sensor 170 is installed on a protruding portion 180 which allows a light 300, such as laser, to pass from the level sensor 170 through the protruding portion 180 to the top surface 210 of the collected molten metal and from the top surface 210 to pass through the protruding portion 180, back to the level sensor 170 for detecting a surface level of the molten metal in the third portion 160. In some embodiments, the level sensor 170 is connected to the gate valve controller 190 including at least one processor which sets a threshold of the surface level, the processor sends a signal to the gate valve controller 190 to move the gate valve 200 to block the metal droplets 20 from entering the space occupied by the collected molten metal. In some embodiments, the level sensor 170 has a lengthwise axis aligned with the lengthwise axis of the third portion 160.

The third portion 160 of the metal droplet collection bucket 100 has its greatest length L3 connected to the greatest length L2 of the second or connection portion 150. The third portion 160 is formed to be one-piece with the second or connection portion 150 or formed to be a separate part connected with the second or connection portion 150 by adhesive means such as glue or screws. The central axis of the third portion 160 is perpendicular to the central axis of the first portion 140. In some embodiments, the third portion is made of the same material as the second or connection portion 150 and the first portion 140. In other embodiments, the third portion 160 is made of a material different from that of the second or connection portion 150 which is made of the same material as the first portion 140. In some embodiments, the first portion 140, the second or connection portion 150, and the third portion 160 are made of different materials.

In the third portion 160, a gate valve controller 190 is installed with a valve 200, in some embodiments. Upon receiving a signal from the controller of the level sensor 170, the gate valve controller 190 is configured to move the valve 200 into the space above the top surface level of the molten metal collected in the third portion 160. The valve 200 is configured to be positioned horizontally, i.e. along the y direction in FIG. 7, with respect to the central axis of the third portion 160. In this way, the metal droplet 20 will be immobilized on the valve 200 as immobilized metal droplet 20' and will not cause any back-splash of the molten metal in the third portion 160. The valve 200 conceals the space below the valve 200 so that the molten metal cannot evaporate to the first portion 140 or second portion 150.

In FIG. 7, a gas supply 240 is installed with an outlet guarded by a valve 250. After closing the valve 200, the valve 250 of the gas supply 240 is opened to allow the gas to pass into the outlet tube. In some embodiments, the gas includes inert gas such as argon and nitrogen. On the outlet tube, heaters 260 are installed to heat the outlet tube so as to heat the gas passing through the outlet tube. The heaters 260 include a resistive heater, radiation heater, and flame heater. Then, the heated gas passes through a mesh or dust filter 270 so as to allow only clean heated gas to enter the space above the top surface level of the molten metal collected in the third portion 160. The heated gas increases the pressure in the space below the valve 200 to be the same as the pressure outside the third portion 160, i.e. ambient atmospheric pressure. Once the ambient atmospheric pressure is reached, the tube 280 is opened to allow drainage of the molten metal to a drainage tool 400 such as an open bucket. Since the valve 200 is closed, the first and second portions of the metal droplet collection bucket 100 can be maintained at a low pressure. After the drainage operation is finished, the third portion is vacuumed by opening the valve 200 or vacuumed via a pump connected to the third portion, and after the pressure in the third portion becomes substantially equal to the pressure in the first and second portions, the valve 200 is opened to collect metal droplets.

In FIG. 7, a heating element 230 wraps around the first, second and third portions 140, 150 and 160. The heating element 230 is enclosed in a portion 220 positioned in the metal droplet collection bucket 100. The heating element 230 maintains the metal collected in the third portion 160 in a molten state for drainage. Also, the heating element 230 covering the space above the top surface level of the molten metal can assist heating of the gas entering the space from the gas supply 240. In some embodiments, the heating element 230 covers the entire third portion 160. In other embodiments, the heating element 230 partially covers the third portion 160. In some embodiments, the tube 280 is guarded by a tap or valve (not shown). The inner wall or surface of the first, second, and third portions 140, 150, 160 is labeled 100$iw$, and the outer wall or surface is labeled 100$ow$.

Figure 8:
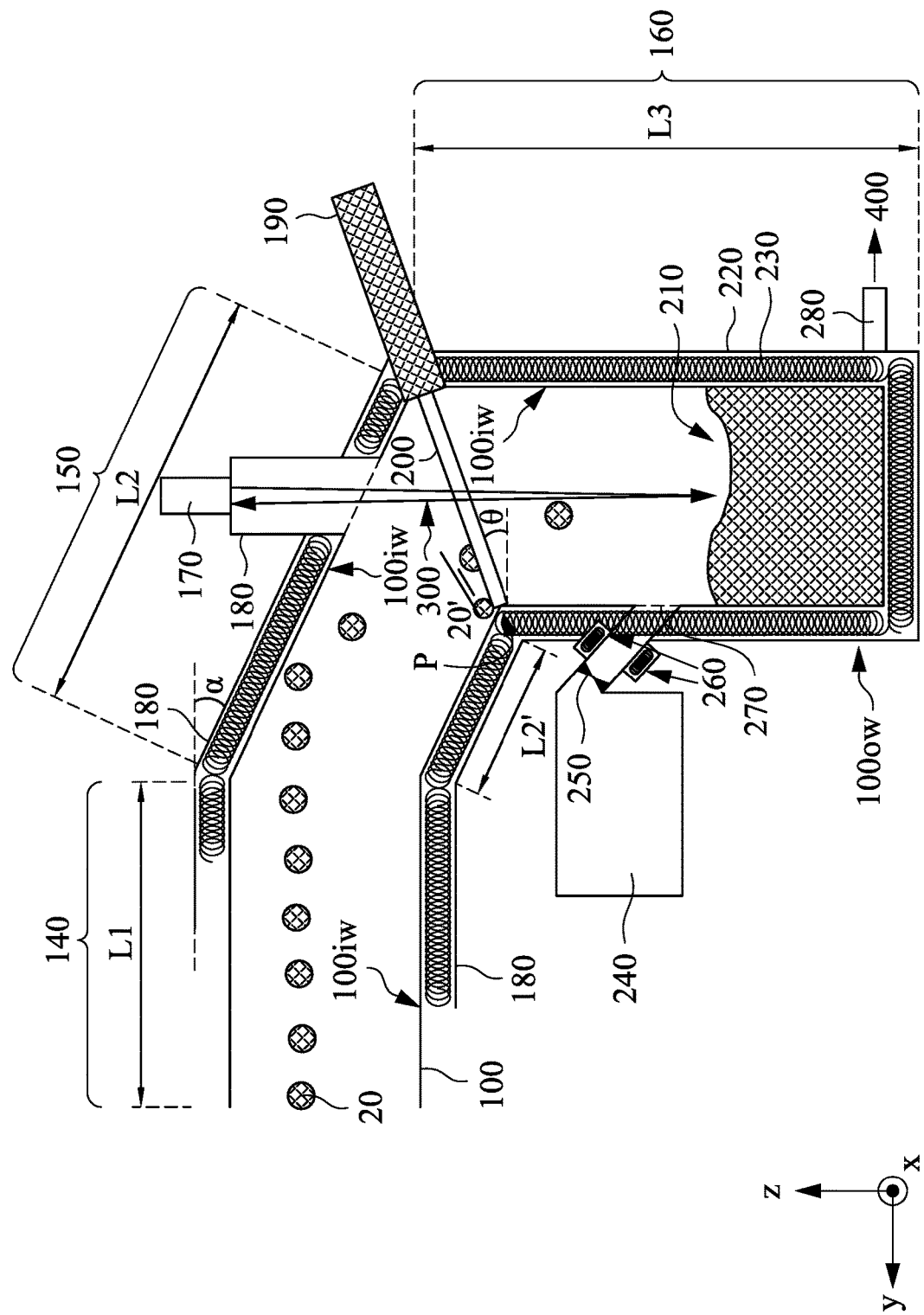
FIG. 8 shows a cross-sectional view of a metal droplet collection bucket, according to another embodiment of the present disclosure.

FIG. 8 shows a cross-sectional view of a metal droplet collection bucket 100. Compared with the embodiment in FIG. 5, the metal droplet collection bucket 100 includes heating element 230 which covers the first, second and third portions 140, 150 and 160, instead of just covering the third portion 160. In this way, heat is applied to the first and second portions 140 and 150 so as to maintain the liquid state of the metal droplets 20 that hit against the inner wall 100$iw$ of the first and second portions 140 and 150. Also, compared with the metal droplet collection bucket 100 in FIG. 7, the metal droplet collection bucket 100 has the valve 200 installed at an angle θ(θ is greater than 0 degrees and less than 90 degrees) with respect to the lengthwise axis of the first portion 140. In this way, the metal droplet 20 blocked by the valve 200 can flow to a left edge of the valve 200 and becomes immobilized metal droplet 20'. When the valve 200 is opened, metal droplets 20' can easily flow to the third portion 160.

In FIG. 8, the metal droplet collection bucket 100 has three portions, i.e. a first portion 140, a second or connection portion 150, and a third portion 160, in some embodiments of the present disclosure. The first portion 140 is the portion of the metal droplet collection bucket 100, which the metal droplet 20 first encounters in some embodiments of the present disclosure. The first portion 140 is aligned with the metal droplet ejection system 10 so that the path of the high speed metal droplets 20 passes into the first portion 140, in some embodiments of the present disclosure. The inner walls 100$iw$ of the first portion 140 are parallel, in some embodiments of the present disclosure. In some embodiments, the first portion 140 has a cylindrical shape with a circular cross section cutting in a path perpendicular to the path of the metal droplets 20, i.e. cutting along the x direction in FIG. 8. The first portion 140 is made of a metal or a metal alloy including stainless steel, copper, aluminum and aluminum alloy, in some embodiments of the present disclosure. The first portion 140 has a length of L1 which is designed to be short in a small EUV chamber and is designed to be long to avoid back-splash of metal droplets 20 inside the metal droplet collection bucket 100. The length L1 can be in a range from about 5 cm to about 10 cm in some embodiments of the present disclosure, depending on the speed of the metal droplets 20 and the size of the EUV chamber.

The metal droplet collection bucket 100 also includes a second or connection portion 150. In some embodiments, the second or connection portion 150 is one-piece with the first portion 140 or is a separate part connected with the first portion 140 by an adhesive means such as glue or screws. In some embodiments, the second or connection portion 150 is made of the same material as the first portion 140. In other embodiments, the second or connection portion 150 is made of a material different from that of the first portion 140. In some embodiments, the second or connection portion 150 deviates at an angle α from the lengthwise axis of the first portion 140. The second or connection portion 150 has its greatest length of L2 and its smallest length of L2' and in some embodiments, the greatest length L2 is the same as the length L1 of the first portion 140. In some embodiments, the length L2' is non-zero. In other embodiments, the length L2' is zero (not shown) and the first portion 140 directly contacts the third portion 160. In some embodiments, in the second or connection portion 150, a level sensor 170 is installed on a protruding portion 180 which allows a light 300, such as laser, to pass from the level sensor 170 through the protruding portion 180 to the top surface 210 of the collected molten metal and from the top surface 210 to pass through the protruding portion 180, back to the level sensor 170 for detecting a surface level of the molten metal in the third portion 160. In some embodiments, the level sensor 170 is connected to the gate valve controller 190 including at least one processor which sets a threshold of the surface level, the processor sends a signal to the gate valve controller 190 to move the gate valve 200 to block the metal droplets 20 from entering the space occupied by the collected molten metal. In some embodiments, the level sensor 170 has a lengthwise axis aligned with the lengthwise axis of the third portion 160.

The third portion 160 of the metal droplet collection bucket 100 has its greatest length L3 connected to the greatest length L2 of the second or connection portion 150. The third portion 160 is formed to be one-piece with the second or connection portion 150 or formed to be a separate part connected with the second or connection portion 150 by adhesive means such as glue or screws. The central axis of the third portion 160 is perpendicular to the central axis of the first portion 140. In some embodiments, the third portion is made of the same material as the second or connection portion 150 and the first portion 140. In other embodiments, the third portion 160 is made of a material different from that of the second or connection portion 150 which is made of the same material as the first portion 140. In some embodiments, the first portion 140, the second or connection portion 150, and the third portion 160 are made of different materials.

In the third portion 160, a gate valve controller 190 is installed with a valve 200 at a position between the second portion 150 and the third portion 160 and at an angle θ (θ is greater than 0 degrees and less than 90 degrees) with respect to the lengthwise axis of the first portion 140, i.e. the y direction, in some embodiments. Upon receiving a signal from the controller of the level sensor 170, the gate valve controller 190 is configured to move the valve 200 into the space above the top surface level of the molten metal collected in the third portion 160. In this way, the metal droplet 20 will be immobilized on the valve 200 as immobilized metal droplet 20' and will not cause any back-splash of the molten metal in the third portion 160. The valve 200 conceals the space below the valve 200 so that the molten metal cannot evaporate to the first portion 140 or second portion 150. When the valve 200 is opened, metal droplets 20' can easily flow to the third portion 160.

In FIG. 8, a gas supply 240 is installed with an outlet guarded by a valve 250. After closing the valve 200, the valve 250 of the gas supply 240 is opened to allow the gas to pass into the outlet tube. In some embodiments, the gas includes inert gas such as argon and nitrogen. On the outlet tube, heaters 260 are installed to heat the outlet tube so as to heat the gas passing through the outlet tube. The heaters 260 include a resistive heater, radiation heater, and flame heater. Then, the heated gas passes through a mesh or dust filter 270 so as to allow only clean heated gas to enter the space above the top surface level of the molten metal collected in the third portion 160. The heated gas increases the pressure in the space below the valve 200 to be the same as the pressure outside the third portion 160, i.e. ambient atmospheric pressure. Once the ambient atmospheric pressure is reached, the tube 280 is opened to allow drainage of the molten metal to a drainage tool 400 such as an open bucket. Since the valve 200 is closed, the first and second portions of the metal droplet collection bucket 100 can be maintained at a low pressure. After the drainage operation is finished, the third portion is vacuumed by opening the valve 200 or vacuumed via a pump connected to the third portion, and after the pressure in the third portion becomes substantially equal to the pressure in the first and second portions, the valve 200 is opened to collect metal droplets.

In FIG. 8, a heating element 230 wraps around the first, second and third portions 140, 150 and 160. The heating element 230 is enclosed in a portion 220 positioned in the metal droplet collection bucket 100. The heating element 230 maintains the metal collected in the third portion 160 in a molten state for drainage. Also, the heating element 230 covering the space above the top surface level of the molten metal can assist heating of the gas entering the space from the gas supply 240. In some embodiments, the heating element 230 covers the entire third portion 160. In other embodiments, the heating element 230 partially covers the third portion 160. In some embodiments, the tube 280 is guarded by a tap or valve (not shown). The inner wall or surface of the first, second, and third portions 140, 150, 160 is labeled 100*iw*, and the outer wall or surface is labeled 100*ow*.

Figure 9:
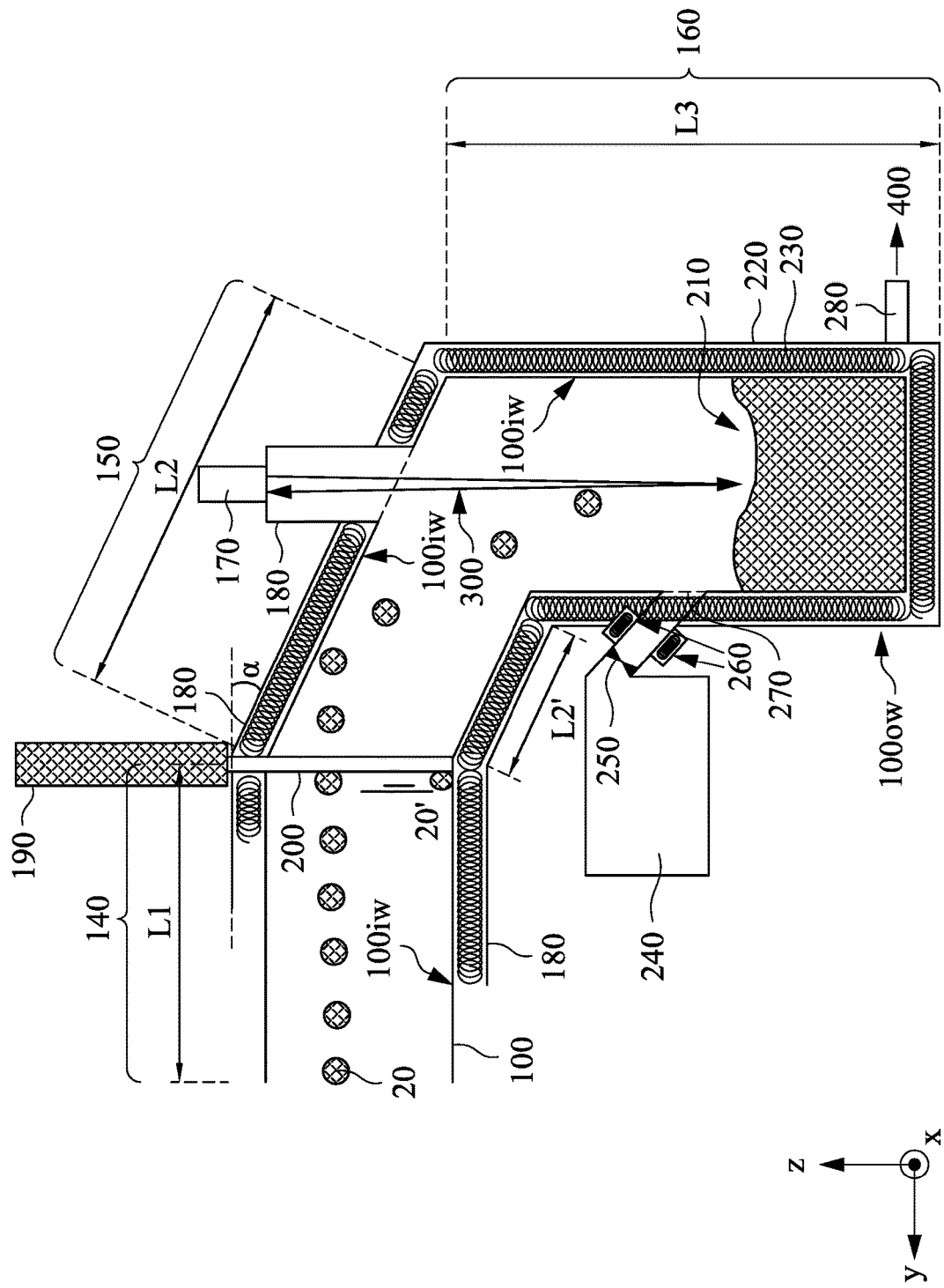
FIG. 9 shows a cross-sectional view of a metal droplet collection bucket, according to another embodiment of the present disclosure.

FIG. 9 shows a cross-sectional view of a metal droplet collection bucket 100. Compared with the embodiment in FIG. 6, the metal droplet collection bucket 100 includes heating element 230 which covers the first, second and third portions 140, 150 and 160, instead of just covering the third portion 160. In this way, heat is applied to the first and second portions 140 and 150 so as to maintain the liquid state of the metal droplets 20 that hit against the inner wall 100*iw* of the first and second portions 140 and 150. Compared with the metal droplet collection bucket 100 in FIGS. 4 and 5, the metal droplet collection bucket 100 has the valve 200 installed at 90 degrees with respect to the lengthwise axis (y axis) of the first portion 140. In this way, the metal droplet 20 blocked by the valve 200 can flow to a bottom edge of the valve 200 and becomes immobilized metal droplet 20'. When the valve 200 is opened, metal droplets 20' can easily flow to the second and third portions 150 and 160.

In FIG. 9, the metal droplet collection bucket 100 has three portions, i.e. a first portion 140, a second or connection portion 150, and a third portion 160, in some embodiments of the present disclosure. The first portion 140 is the portion of the metal droplet collection bucket 100, which the metal droplet 20 first encounters in some embodiments of the present disclosure. The first portion 140 is aligned with the metal droplet ejection system 10 so that the path of the high speed metal droplets 20 passes into the first portion 140, in some embodiments of the present disclosure. The inner walls 100*iw* of the first portion 140 are parallel, in some embodiments of the present disclosure. In some embodiments, the first portion 140 has a cylindrical shape with a circular cross section cutting in a path perpendicular to the path of the metal droplets 20, i.e. cutting along the x direction in FIG. 9. The first portion 140 is made of a metal or a metal alloy including stainless steel, copper, aluminum and aluminum alloy, in some embodiments of the present disclosure. The first portion 140 has a length of L1 which is designed to be short in a small EUV chamber and is designed to be long to avoid back-splash of metal droplets 20 inside the metal droplet collection bucket 100. The length L1 can be in a range from about 5 cm to about 10 cm in some embodiments of the present disclosure, depending on the speed of the metal droplets 20 and the size of the EUV chamber.

A gate valve controller 190 is installed with a valve 200 at a position between the second portion 150 and the first portion 140 and at 90 degrees with respect to the lengthwise axis of the first portion 140, i.e. the y direction, in some embodiments. Upon receiving a signal from the controller of the level sensor 170, the gate valve controller 190 is configured to move the valve 200 into the space above the top surface level of the molten metal collected in the third portion 160. In this way, the metal droplet 20 will be immobilized on the valve 200 as immobilized metal droplet 20' and will not cause any back-splash of the molten metal in the third portion 160. The valve 200 conceals the space below the valve 200 so that the molten metal cannot evaporate to the first portion 140 or second portion 150. When the valve 200 is opened, metal droplets 20' can easily flow to the second and third portions 150 and 160.

The metal droplet collection bucket 100 also includes a second or connection portion 150. In some embodiments, the second or connection portion 150 is one-piece with the first portion 140 or is a separate part connected with the first portion 140 by an adhesive means such as glue or screws. In some embodiments, the second or connection portion 150 is made of the same material as the first portion 140. In other embodiments, the second or connection portion 150 is made of a material different from that of the first portion 140. In some embodiments, the second or connection portion 150 deviates at an angle α from the lengthwise axis of the first portion 140. The second or connection portion 150 has its greatest length of L2 and its smallest length of L2' and in some embodiments, the greatest length L2 is the same as the length L1 of the first portion 140. In some embodiments, the length L2' is non-zero. In other embodiments, the length L2' is zero (not shown) and the first portion 140 directly contacts the third portion 160. In some embodiments, in the second or connection portion 150, a level sensor 170 is installed on a protruding portion 180 which allows a light 300, such as laser, to pass from the level sensor 170 through the protruding portion 180 to the top surface 210 of the collected molten metal and from the top surface 210 to pass through the protruding portion 180, back to the level sensor 170 for detecting a surface level of the molten metal in the third portion 160. In some embodiments, the level sensor 170 is connected to the gate valve controller 190 including at least one processor which sets a threshold of the surface level, the processor sends a signal to the gate valve controller 190 to move the gate valve 200 to block the metal droplets 20 from entering the space occupied by the collected molten metal. In some embodiments, the level sensor 170 has a lengthwise axis aligned with the lengthwise axis of the third portion 160.

The third portion 160 of the metal droplet collection bucket 100 has its greatest length L3 connected to the greatest length L2 of the second or connection portion 150. The third portion 160 is formed to be one-piece with the second or connection portion 150 or formed to be a separate part connected with the second or connection portion 150 by adhesive means such as glue or screws. The central axis of the third portion 160 is perpendicular to the central axis of the first portion 140. In some embodiments, the third portion is made of the same material as the second or connection portion 150 and the first portion 140. In other embodiments, the third portion 160 is made of a material different from that of the second or connection portion 150 which is made of the same material as the first portion 140. In some embodiments, the first portion 140, the second or connection portion 150, and the third portion 160 are made of different materials.

In FIG. 9, a gas supply 240 is installed with an outlet guarded by a valve 250. After closing the valve 200, the valve 250 of the gas supply 240 is opened to allow the gas to pass into the outlet tube. In some embodiments, the gas includes inert gas such as argon and nitrogen. On the outlet tube, heaters 260 are installed to heat the outlet tube so as to heat the gas passing through the outlet tube. The heaters 260 include a resistive heater, radiation heater, and flame heater. Then, the heated gas passes through a mesh or dust filter 270 so as to allow only clean heated gas to enter the space above the top surface level of the molten metal collected in the third portion 160. The heated gas increases the pressure in the space below the valve 200 to be the same as the pressure outside the third portion 160, i.e. ambient atmospheric pressure. Once the ambient atmospheric pressure is reached, the tube 280 is opened to allow drainage of the molten metal to a drainage tool 400 such as an open bucket. Since the valve 200 is closed, the first and second portions of the metal droplet collection bucket 100 can be maintained at a low pressure.

After the drainage operation is finished, the third portion is vacuumed by opening the valve 200 or vacuumed via a pump connected to the third portion, and after the pressure in the third portion becomes substantially equal to the pressure in the first and second portions, the valve 200 is opened to collect metal droplets.

In FIG. 9, a heating element 230 wraps around the first, second and third portions 140, 150 and 160. The heating element 230 is enclosed in a portion 220 positioned in the metal droplet collection bucket 100. The heating element 230 maintains the metal collected in the third portion 160 in a molten state for drainage. Also, the heating element 230 covering the space above the top surface level of the molten metal can assist heating of the gas entering the space from the gas supply 240. In some embodiments, the heating element 230 covers the entire third portion 160. In other embodiments, the heating element 230 partially covers the third portion 160. In some embodiments, the tube 280 is guarded by a tap or valve (not shown). The inner wall or surface of the first, second, and third portions 140, 150, 160 is labeled 100iw, and the outer wall or surface is labeled 100ow.

Figure 10:
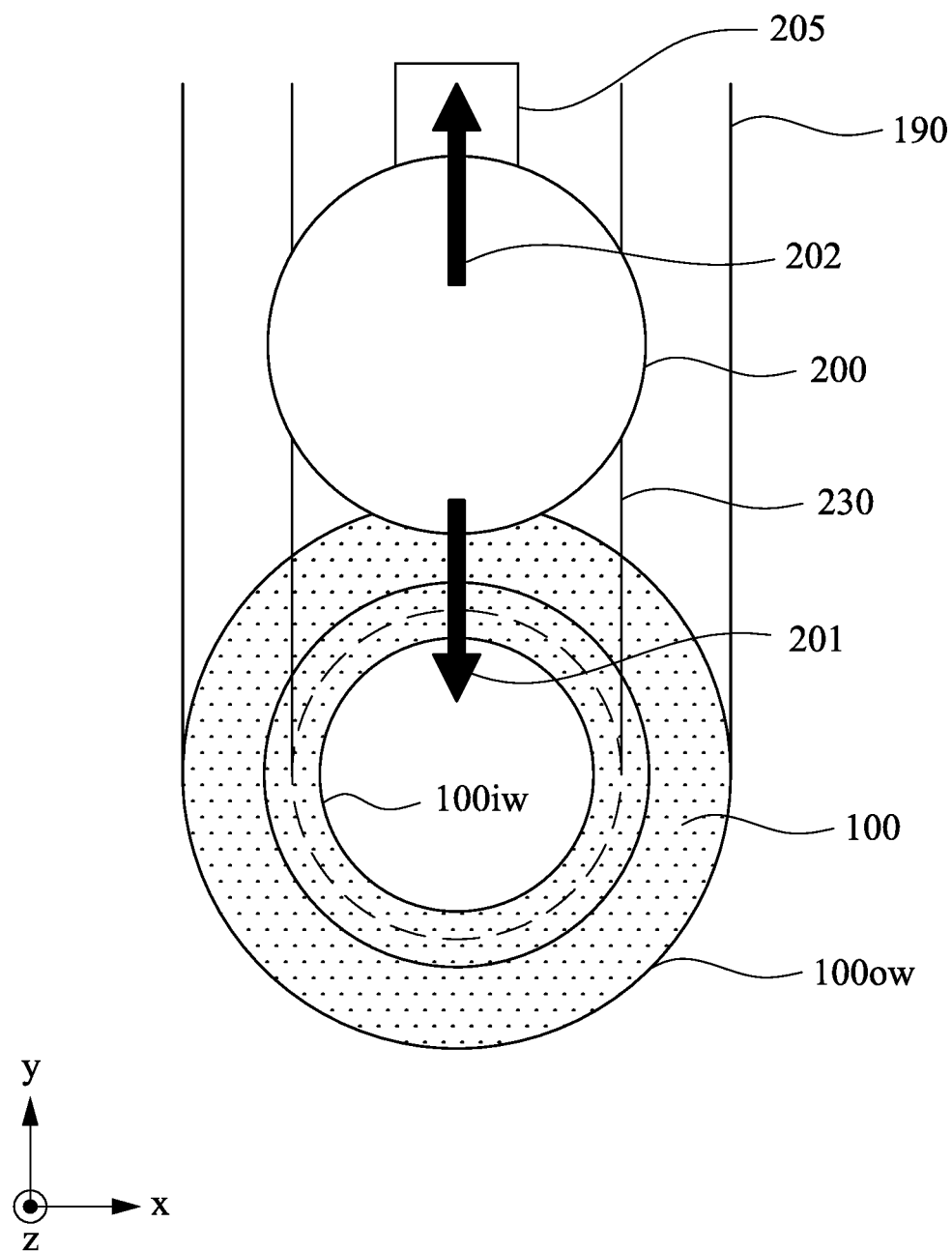
FIG. 10 shows a top plan view of a valve in the metal droplet collection bucket, according to an embodiment of the present disclosure.

FIG. 10 shows a top plan view of the valve 200 in the metal droplet collection bucket 100. The embodiment in FIG. 10 can be applied to the valve 200 in, for examples, FIGS. 4, 7, 8, and 9. In FIG. 10, a heating element 230 is wired to an enclosure 220 which is surrounded by the metal droplet collection bucket 100. In some embodiments, the enclosure 220 is positioned between the inner wall 100iw and outer wall 100ow of the metal droplet collection bucket 100. In some embodiments, at one end of the valve 200, a thermocouple 205 is connected to the valve 200 to monitor the temperature of the valve 200 so as to adjust the heating power of heating element 230 to apply heat to metal droplets 20' immobilized on the valve 200. In some embodiments, the gate valve controller 190 controls the movement of the valve 200, i.e. the forward movement 201 into the space between the inner wall 100iw and outer wall 100ow of the metal droplet collection bucket 100, and the backward movement 202 into the slot (not shown) of the gate valve controller 190. In some embodiments, the valve 200 has a coverage greater than the heating element 230 in the enclosure 220.

Figure 11:
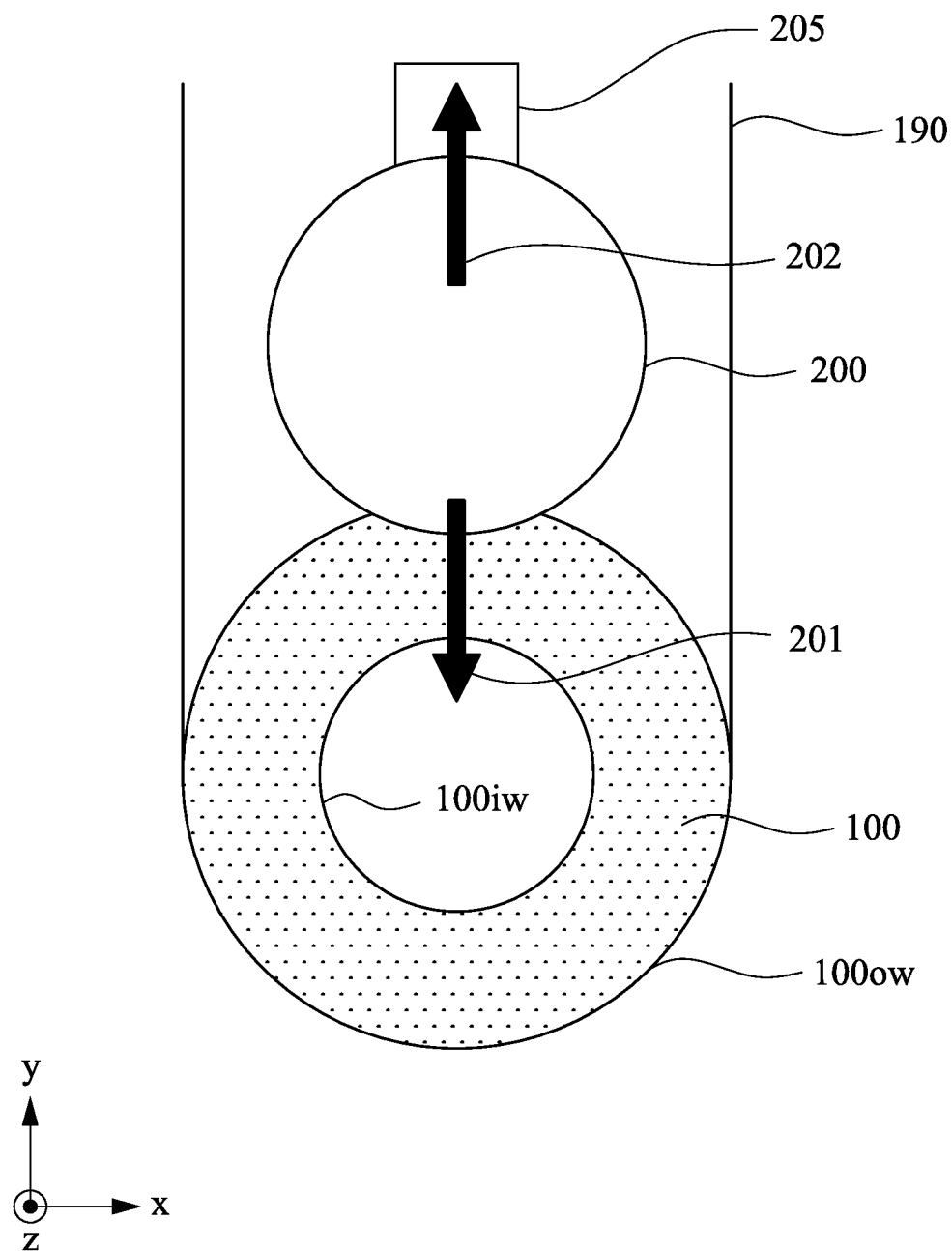
FIG. 11 shows a top plan view of a valve in the metal droplet collection bucket, according to another embodiment of the present disclosure.

FIG. 11 shows a top plan view of the valve 200 in the metal droplet collection bucket 100. The embodiment in FIG. 11 can be applied to the valve 200 in, for examples, FIGS. 5 and 6. Compared with the embodiment in FIG. 10, the embodiment in FIG. 11 does not include a heating element 230 to heat the valve 200. In some embodiments, at one end of the valve 200, a thermocouple 205 is connected to the valve 200. The thermocouple 205 monitors the temperature of the valve 200 so as to adjust the heating power of the heating element 230 in other portions of the metal droplet collection bucket 100. In some embodiments, the gate valve controller 190 controls the movement of the valve 200, i.e. the forward movement 201 into the space between the inner wall 100*iw* and outer wall 100*ow* of the metal droplet collection bucket 100, and the backward movement 202 into the slot (not shown) of the gate valve controller 190. In some embodiments, the valve 200 has a coverage greater than the heating element 230 in the enclosure 220.

Figure 12:
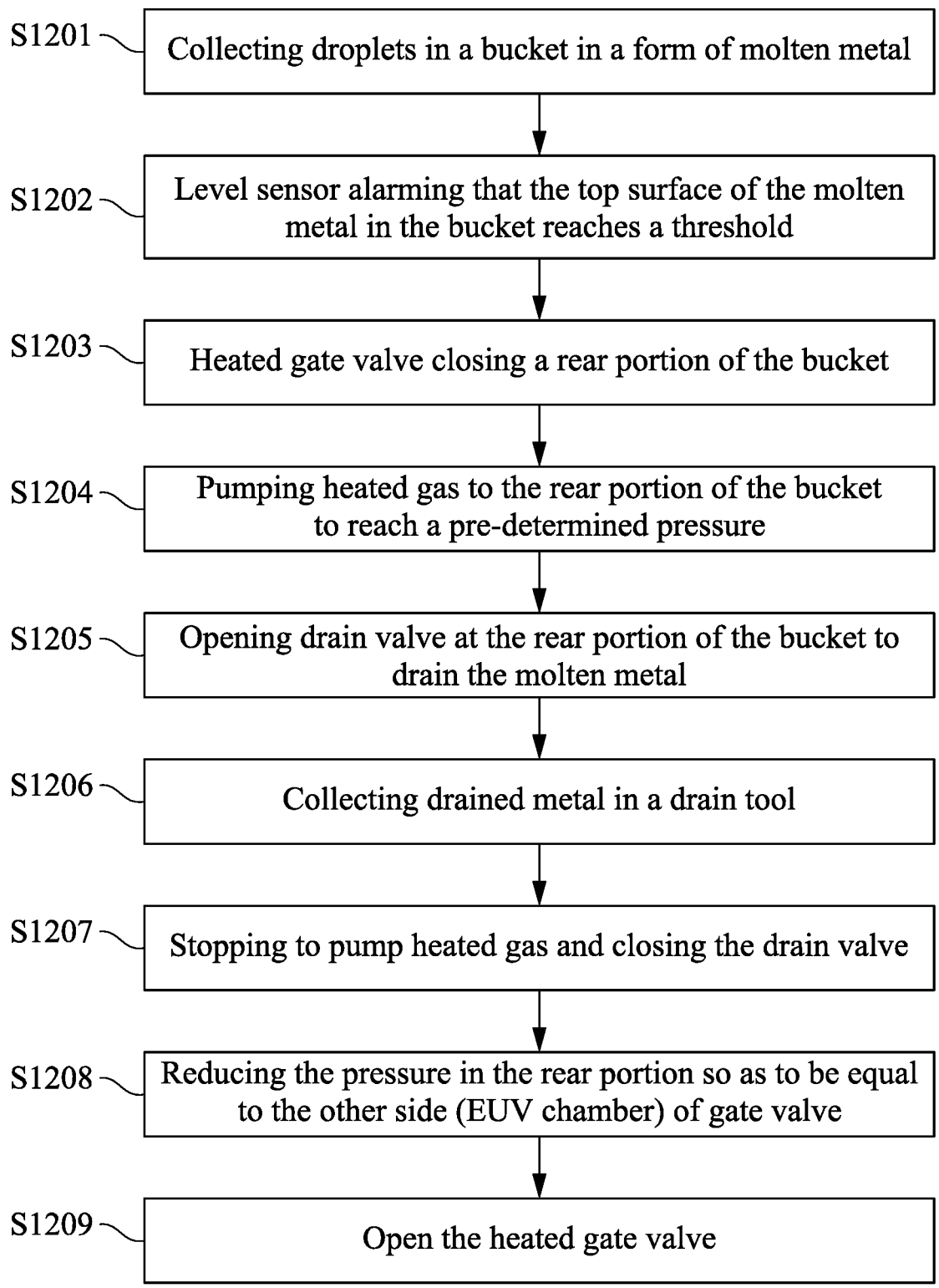
FIG. 12 shows a flowchart of operations of using the metal droplet collection bucket, according to an embodiment of the present disclosure.

FIG. 12 shows a flow chart of operations of a method of using the metal droplet collection bucket 100. The method includes the operation S1201 which collects the metal droplets in a metal droplet collection bucket in a form of molten metal. Then, in operation 1202, a level sensor alarms that the top surface of the molten metal in the bucket reaches a threshold, for example, the level sensor sends a signal to a controller including a processor. In operation S1203, a heated gate valve closes a rear portion of the metal droplet collection bucket 100. Then, in operation S1204, heated gas is pumped to the isolated rear portion of the metal droplet collection bucket 100 until a pre-determined pressure such as ambient atmospheric pressure is reached. In operation S1205, a drain valve at the rear portion of the metal droplet collection bucket is opened to drain the molten metal. Then, in operation S1206, the drained metal is collected in a drain tool such as an open bucket. In operation S1207, pumping of the heated gas is stopped and the drain valve is closed. Then, in operation 51208, the pressure in the isolated rear portion of the metal droplet collection bucket 100 is lowered by a vacuum pump to the same level as the EUV chamber at the other side of the gate valve. In operation S1209, the heated gate valve is opened. During this process, the EUV photolithography on the other side of the closed gate valve 200 is not disturbed and the production is not paused by the drainage procedure. To one of ordinary skill in the art, the operation steps in FIG. 12 can be added or subtracted, and re-arranged.

In the present disclosure, all or a part of the controller may be implemented as one or more of electronic circuits including, but not limited to, a semiconductor device, a semiconductor integrated circuit (IC) or an LSI. The LSI or IC can be integrated into one chip, or also can be a combination of plural chips. The name used here is LSI or IC, but it may also be called system LSI, VLSI (very large scale integration), or ULSI (ultra large scale integration) depending on the degree of integration. A Field Programmable Gate Array (FPGA) that can be programmed after manufacturing an LSI or a reconfigurable logic device that allows reconfiguration of the connection or setup of circuit cells inside the LSI can be used for the same purpose. Further, it is also possible that all or a part of the functions or operations of the controller(s) are implemented by executing software. In such a case, the software is recorded on one or more non-transitory recording media such as a ROM, an optical disk or a hard disk drive, and when the software is executed by a processor, the software causes the processor together with peripheral devices to execute the functions specified in the software. A system or apparatus may include such one or more non-transitory recording media on which the software is recorded and a processor together with necessary hardware devices such as an interface.

It will be understood that not all advantages have been necessarily discussed herein, no particular advantage is required for all embodiments or examples, and other embodiments or examples may offer different advantages.

According to some embodiments of the present disclosure, an extreme ultra-violet (EUV) source to generate EUV radiation is disclosed. The EUV source includes a laser, a target material droplet generator; and a metal droplet collection bucket to receive metal droplets generated from the target material droplet generator. The metal droplet collection bucket includes a droplet collection tube, a gate valve configured to close a rear portion of the droplet collection tube, a gas supply configured to supply a gas into the rear portion of the droplet collection tube, and a drain tube connecting an interior of the metal droplet collection bucket with an outside of the metal droplet collection bucket. The droplet collection tube includes a first portion facing the target material droplet generator, a third portion which is the rear portion, and a second portion connecting the first portion and the third portion. In an embodiment, the EUV lithography system also includes a heating element wrapping only around the third portion. In another embodiment, the EUV lithography system also includes a heating element wraps around the first portion, the second portion, and the third portion. In an embodiment, the heating element partially wraps around the third portion. In another embodiment, wherein the heating element entirely wraps around the third portion. In an embodiment, the gate valve is positioned vertically with respect to a lengthwise axis of the first portion, between the first portion and the second portion. In another embodiment, the gate valve is positioned between the second portion and the third portion and makes an angle with a lengthwise axis of the first portion, wherein the angle is greater than zero degree and less than 90 degrees. In another embodiment, the gate valve is positioned horizontally in the third portion. The gate valve is connected to a thermocouple.

According to some embodiments of the present disclosure, a droplet collection bucket is disclosed. The droplet collection bucket includes a droplet collection tube, a level sensor positioned on the droplet collection tube, a gate valve configured to close a rear portion of the droplet collection tube, a gas supply configured to supply a gas into the rear portion of the droplet collection tube, a heating element wrapping around the droplet collection tube, and a drain tube connecting an interior of the droplet collection tube with an outside of the droplet collection tube. The droplet collection tube includes a first portion, a second portion, and a third portion which is the rear portion. In an embodiment, the heating element wraps only around the third portion. In another embodiment, the heating element wraps around the first portion, the second portion, and the third portion. In an embodiment, the heating element partially wraps around the third portion. In another embodiment, the heating element entirely wraps around the third portion. In an embodiment, the gate valve is positioned vertically between the first portion and the second portion. In another embodiment, the gate valve is positioned between the second portion and the third portion and makes an angle with a lengthwise axis of the first portion, wherein the angle is greater than zero degree and less than 90 degrees. In another embodiment, wherein the gate valve is positioned horizontally in the third portion.

According to some method embodiments of the present disclosure, a method of operating a droplet collection bucket is disclosed. The method includes operations of collecting metal droplets in a metal droplet collection bucket in a form of molten metal, generating by a level sensor an alarm when a top surface of the molten metal in the metal droplet collection bucket reaches a threshold, sending a signal, by the level sensor, to a gate valve to close the gate valve and to conceal a rear portion of the metal droplet collection bucket, pumping a heated gas into the rear portion to reach a pressure the same as outside of the metal droplet collection bucket, opening a drain tube to allow drainage of the molten metal to the outside, closing the drain tube and stopping the pumping of the heated gas, lowering pressure in the concealed rear portion to a same pressure as other side of the gate valve; and opening the gate valve.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An extreme ultra-violet (EUV) source to generate EUV radiation, comprising:
    a target material droplet generator; and
    a metal droplet collection bucket configured to receive metal droplets generated from the target material droplet generator, wherein the metal droplet collection bucket includes:
        a droplet collection tube,
        a level sensor positioned on the droplet collection tube and configured to detect a top surface of a collection of one or more droplets in the metal droplet collection bucket,
        a gate valve configured to close a rear portion of the droplet collection tube,
        a gas supply configured to supply a gas into the rear portion of the droplet collection tube, and
        a drain tube connecting an interior of the metal droplet collection bucket with an outside of the metal droplet collection bucket.

2. The EUV source of claim 1, wherein the droplet collection tube of the metal droplet collection bucket includes a first portion, a second portion, and a third portion which is the rear portion,
    the second portion is located between the first portion and the third portion, and
    the first portion has an inlet through which metal droplets enter into the droplet collection tube.

3. The EUV source of claim 2, wherein the gas supply of the metal droplet collection bucket comprises a gas valve between the gas supply and the rear portion of the droplet collection tube.

4. The EUV source of claim 2, wherein the gas valve of the metal droplet collection bucket is configured to be opened when the gate valve is closed.

5. The EUV source of claim 3, wherein the gas valve of the metal droplet collection bucket is configured to be closed when the gate valve is opened.

6. The EUV source of claim 3, wherein the metal droplet collection bucket further comprises a gate valve controller coupled to the gate valve and configured to open and close the gate valve.

7. The EUV source of claim 2, wherein the gate valve of the metal droplet collection bucket is positioned vertically between the first portion and the second portion.

8. The EUV source of claim 2, wherein the gate valve of the metal droplet collection bucket is positioned between the second portion and the third portion and makes an angle with a lengthwise axis of the first portion, wherein the angle is greater than zero degree and less than 90 degrees.

9. The EUV source of claim 2, wherein the gate valve of the metal droplet collection bucket is positioned horizontally in the third portion.

10. An extreme ultra-violet (EUV) source to generate EUV radiation, comprising:
    a target material droplet generator; and
    a metal droplet collection bucket configured to receive metal droplets generated from the target material droplet generator, wherein the metal droplet collection bucket includes:
        a droplet collection tube,
        a level sensor positioned on the droplet collection tube and configured to detect
        a top surface of a collection of one or more droplets in the metal droplet collection bucket,
        a gate valve configured to close a rear portion of the droplet collection tube,
        a gas supply configured to supply a gas into the rear portion of the droplet collection tube,
        a heating element wrapping around the droplet collection tube, and
        a drain tube connecting an interior of the droplet collection tube with an outside of the droplet collection tube.

11. The EUV source of claim 10, wherein the droplet collection tube of the metal droplet collection bucket includes:
    a first portion which is a front portion configured to receive the metal droplets,
    a third portion which is the rear portion configured to hold molten metal, and
    a second portion connecting the first portion and the third portion.

12. The EUV source of claim 11, wherein the heating element wrapping only around the third portion.

13. The EUV source of claim 11, wherein the heating element wrapping around the first portion, the second portion, and the third portion.

14. The EUV source of claim 12, wherein the heating element partially wraps around the third portion.

15. The EUV source of claim 12, wherein the heating element entirely wraps around the third portion.

16. The EUV source of claim 11, wherein the gate valve of the metal droplet collection bucket is positioned vertically with respect to a lengthwise axis of the first portion, between the first portion and the second portion.

17. The EUV source of claim 11, wherein the gate valve of the metal droplet collection bucket is positioned between the second portion and the third portion and makes an angle with a lengthwise axis of the first portion, wherein the angle is greater than zero degree and less than 90 degrees.

18. The EUV source of claim 11, wherein the gate valve of the metal droplet collection bucket is positioned horizontally in the third portion.

19. The EUV source of claim 10, wherein the gate valve of the metal droplet collection bucket is connected to a thermocouple.

20. A method of operating an extreme ultra-violet (EUV) source, comprising:
- collecting metal droplets in a metal droplet collection bucket of the EUV source in a form of molten metal;
- generating by a level sensor of the metal droplet collection bucket of the EUV source an alarm when a top surface of the molten metal in the metal droplet collection bucket of the EUV source reaches a threshold;
- sending a signal, by the level sensor of the metal droplet collection bucket of the EUV source, to a gate valve of the metal droplet collection bucket of the EUV source to close the gate valve and to conceal a rear portion of the metal droplet collection bucket of the EUV source;
- pumping a heated gas into the rear portion of the metal droplet collection bucket of the EUV source to reach a same pressure as outside of the metal droplet collection bucket of the EUV source;
- opening a drain tube of the metal droplet collection bucket of the EUV source to allow drainage of the molten metal to the outside;
- closing the drain tube of the metal droplet collection bucket of the EUV source and stopping the pumping of the heated gas;
- lowering pressure in the rear portion of the metal droplet collection bucket of the EUV source to a same pressure as other side of the gate valve; and
- opening the gate valve of the metal droplet collection bucket of the EUV source.

\* \* \* \* \*